(12) United States Patent
Oki et al.

(10) Patent No.: US 9,001,860 B2
(45) Date of Patent: Apr. 7, 2015

(54) LASER DIODE DEVICE INCLUDING A TOP ELECTRODE WITH FIRST AND SECOND SECTIONS

(75) Inventors: Tomoyuki Oki, Tokyo (JP); Hideki Watanabe, Tokyo (JP); Rintaro Koda, Tokyo (JP); Masaru Kuramoto, Tokyo (JP); Hiroyuki Yokoyama, Tokyo (JP)

(73) Assignees: Sony Corporation, Tokyo (JP); Tohoku University, Sendai-Shi (JP)

( * ) Notice: Subject to any disclaimer, the term of this patent is extended or adjusted under 35 U.S.C. 154(b) by 343 days.

(21) Appl. No.: 13/310,260

(22) Filed: Dec. 2, 2011
(Under 37 CFR 1.47)

(65) Prior Publication Data
US 2012/0147917 A1 Jun. 14, 2012

(30) Foreign Application Priority Data
Dec. 8, 2010 (JP) .................................. 2010-273359

(51) Int. Cl.
*H01S 5/323* (2006.01)
*H01S 5/343* (2006.01)
*B82Y 20/00* (2011.01)
(Continued)

(52) U.S. Cl.
CPC ............. *H01S 5/34333* (2013.01); *B82Y 20/00* (2013.01); *H01S 5/06253* (2013.01); *H01S 5/0658* (2013.01); *H01S 5/1014* (2013.01);
(Continued)

(58) Field of Classification Search
CPC ........................... H01S 5/1064; H01S 5/34333
USPC ............................................. 372/45.013, 87
See application file for complete search history.

(56) References Cited

U.S. PATENT DOCUMENTS

| 8,483,256 B2 * | 7/2013 | Oki et al. .................. 372/99 |
| 2006/0222024 A1 * | 10/2006 | Gray et al. .................. 372/18 |
| 2010/0020838 A1 * | 1/2010 | Oota et al. ............... 372/45.013 |

FOREIGN PATENT DOCUMENTS

| JP | 2004-007002 | 1/2004 |
| JP | 2004-188678 | 7/2004 |

(Continued)

OTHER PUBLICATIONS

Miyajima et al., "Picosecond optical pulse generation from self-pulsating bisectional GaN-based blue-violet laser diodes", Applied Physics Letters, 2009, pp. 161103/1-161103/3, vol. 94.

*Primary Examiner* — Tod T Van Roy
*Assistant Examiner* — Marcia Golub-Miller
(74) *Attorney, Agent, or Firm* — K&L Gates LLP

(57) ABSTRACT

A laser diode device includes a laminated structure in which a first compound semiconductor layer, a third compound semiconductor layer that has a light emitting region and a saturable absorption region, and a second compound semiconductor layer are sequentially layered, a second electrode, and a first electrode. The laminated structure has ridge stripe structure. The second electrode is separated into a first section to obtain forward bias state by applying a direct current to the first electrode through the light emitting region and a second section to add electric field to the saturable absorption region by an isolation trench. When minimum width of the ridge stripe structure is $W_{MIN}$, and width of the ridge stripe structure of the second section of the second electrode in an interface between the second section of the second electrode and the isolation trench is $W_2$, $1 < W_2/W_{MIN}$ is satisfied.

4 Claims, 15 Drawing Sheets

(51) Int. Cl.
*H01S 5/0625* (2006.01)
*H01S 5/065* (2006.01)
*H01S 5/10* (2006.01)
*H01S 5/14* (2006.01)
*H01S 5/22* (2006.01)

(52) U.S. Cl.
CPC .............. *H01S 5/1064* (2013.01); *H01S 5/141* (2013.01); *H01S 5/22* (2013.01)

(56) References Cited

FOREIGN PATENT DOCUMENTS

| | | |
|---|---|---|
| JP | 2008-47692 | 2/2008 |
| JP | 2010-027935 | 2/2010 |
| JP | 2010-251712 | 11/2010 |

\* cited by examiner

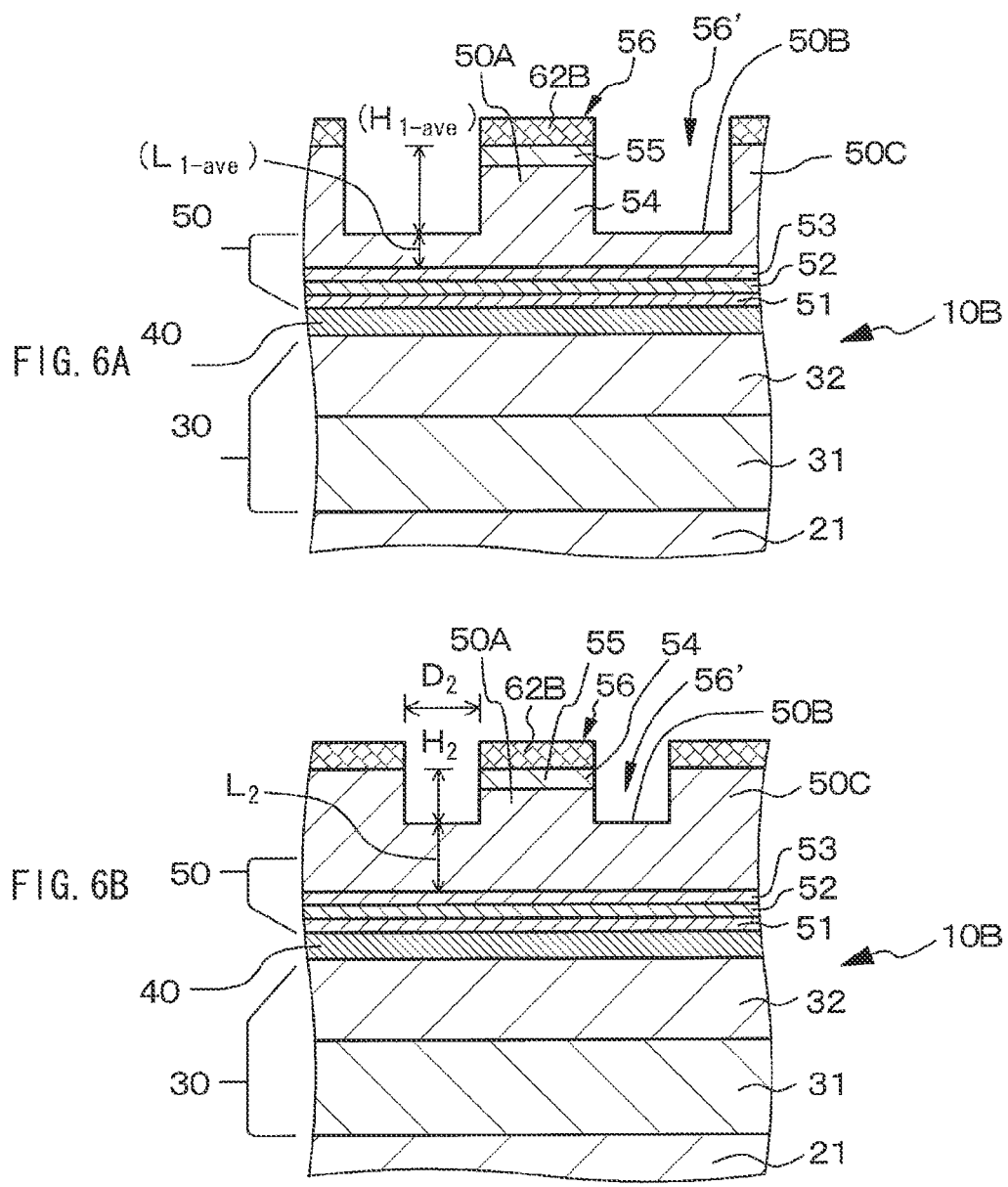

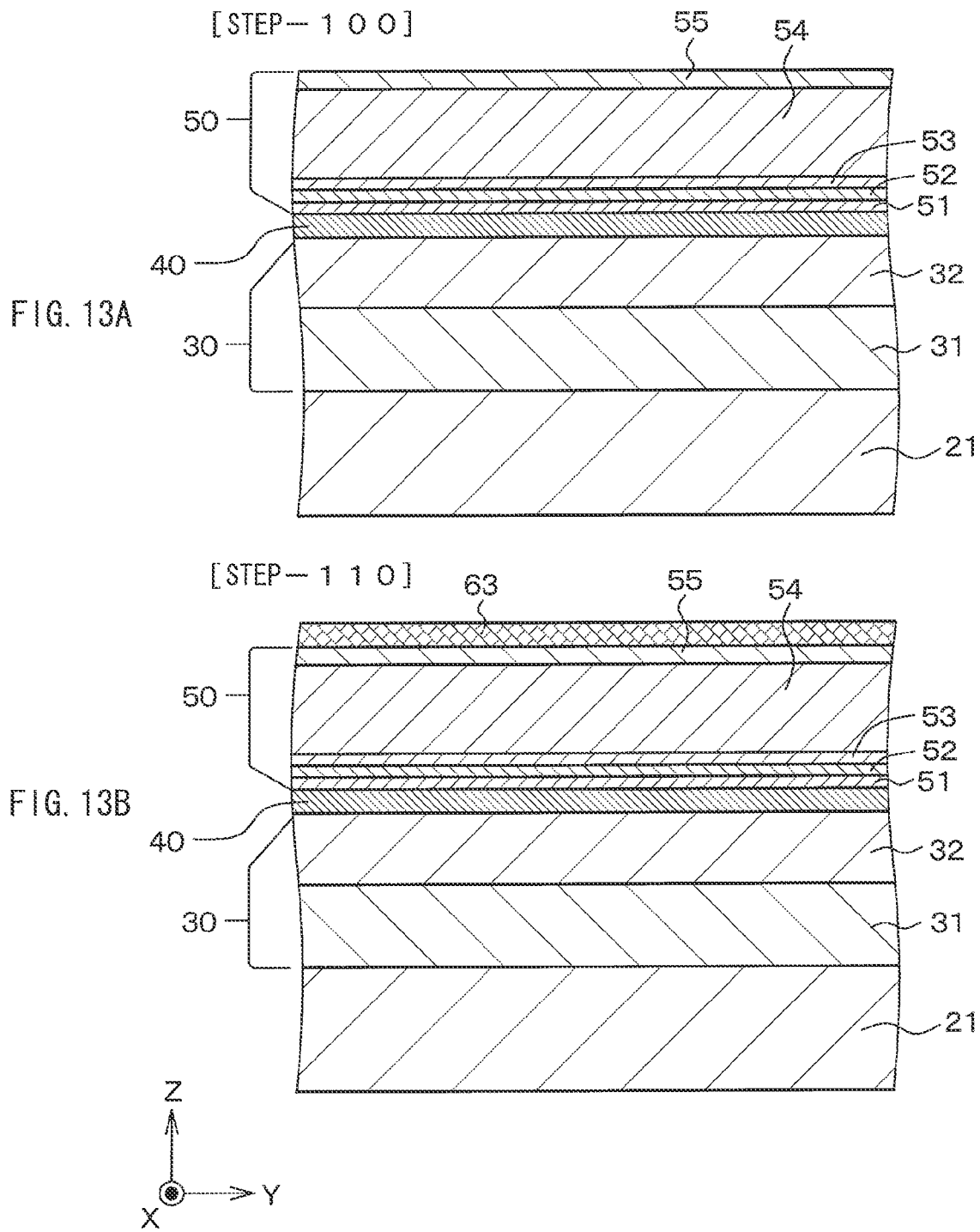

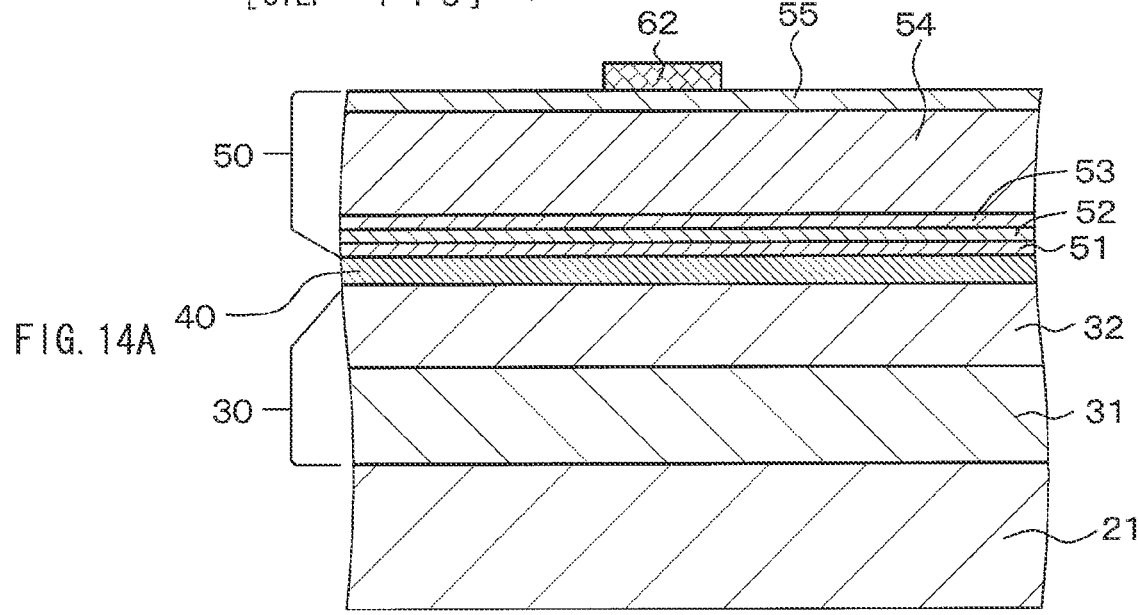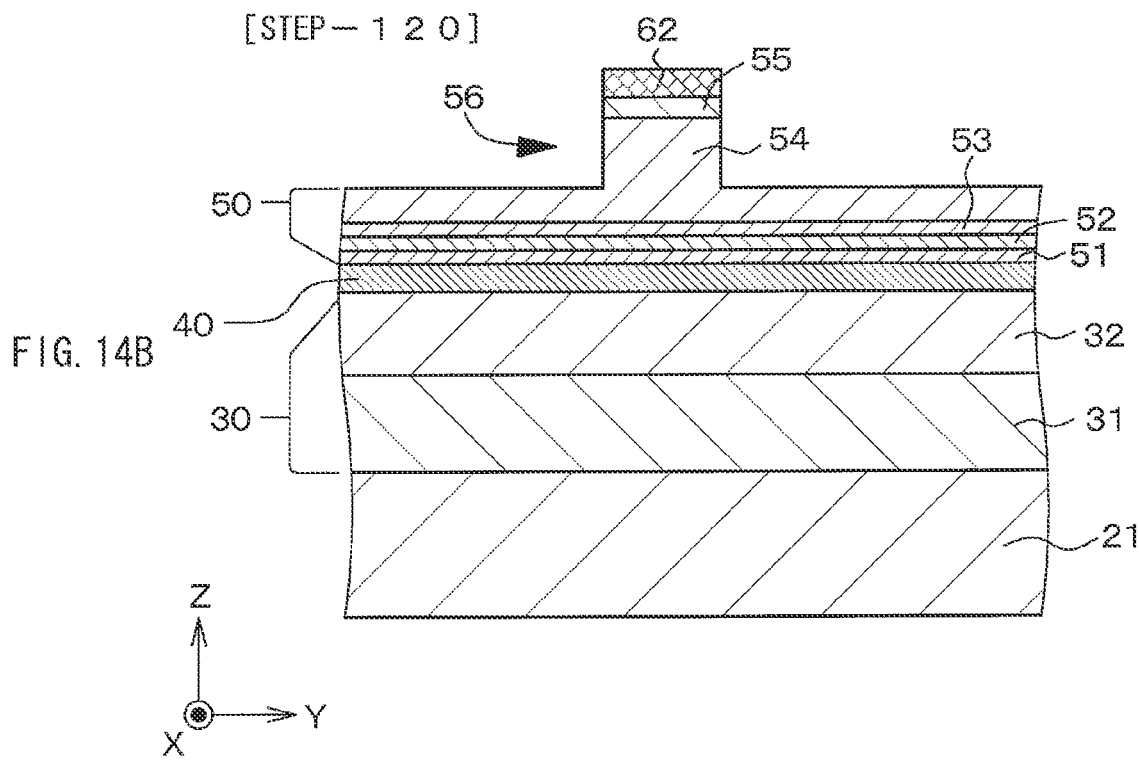

LASER DIODE DEVICE INCLUDING A TOP ELECTRODE WITH FIRST AND SECOND SECTIONS

CROSS REFERENCE TO RELATED APPLICATION

The present application claims priority to Japanese Patent Application No. 2010-273359 filed on Dec. 8, 2010, the disclosure of which is incorporated herein by reference.

BACKGROUND

The present disclosure relates to a laser diode device.

A high power and ultrashort pulse laser diode device that is composed of GaN compound semiconductor and that has light emitting wavelength of 405 nm band has been expected to be a light source for a volumetric optical disc system expected as a next generation optical disc system displacing the Blu-ray optical disc system or has been expected to be a light source needed in the medical field, the bio imaging field and the like. As a method of generating short pulse light in the laser diode device, mainly two methods that are gain switching method and mode-locking method are known. The mode locking is further categorized into active mode locking and passive mode locking. To generate light pulses based on the active mode locking, an external resonator is configured by using a mirror or a lens, and further radio frequency (RF) modulation should be added to the laser diode device. Meanwhile, in the passive mode locking, light pulses are able to be generated by simple direct current drive by using self pulsation operation of the laser diode device.

To enable the self pulsation operation of the laser diode device, the laser diode device should be provided with a light emitting region and a saturable absorption region. Based on arrangement state of the light emitting region and the saturable absorption region, the laser diode device is able to be categorized into SAL (saturable absorber layer) type and WI (weakly index guide) type in which the light emitting region and the saturable absorption region are arranged in the vertical direction, and bi-section type in which the light emitting region and the saturable absorption region are apposed in the resonator direction. The bi-section type laser diode device is known from, for example, Japanese Unexamined Patent Application Publication Nos. 2004-007002, 2004-188678, and 2008-047692. It is known that a bi-section type GaN laser diode device has larger effect of saturable absorption and is able to generate light pulse with a narrower width than in the SAL type laser diode device.

In general, the bi-section type GaN laser diode device includes a laminated structure in which a first compound semiconductor layer that has a first conductivity type and is composed of GaN compound semiconductor, a third compound semiconductor layer that has a light emitting region and a saturable absorption region composed of GaN compound semiconductor, and a second compound semiconductor layer that has a second conductivity type different from the first conductivity type and is composed of GaN compound semiconductor are sequentially layered, a strip-shaped second electrode formed on the second compound semiconductor layer, and a first electrode electrically connected to the first compound semiconductor layer. The second electrode is separated into a first section obtaining forward bias state by applying a direct current to the first electrode through the light emitting region and a second section adding electric field through the saturable absorption region from the first electrode by an isolation trench.

SUMMARY

To enable pulse operation in the bi-section type GaN laser diode device, carrier is injected to the light emitting region while applying reverse bias to the saturable absorption region. Thus, compared to the laser diode device at the time of continuous oscillation operation, load of the saturable absorption region is large. As a result of study of the inventors of the present disclosure, it has been found that the second section of the second electrode or the saturable absorption region is subject to damage, resulting in a disadvantage in long time reliability. In the foregoing Japanese Unexamined Patent Application Publications, no description is given of damage generation in the second section of the second electrode or the saturable absorption region.

In view of the foregoing, in the present disclosure, it is desirable to provide a bi-section type GaN laser diode device that has a configuration and a structure in which damage is less likely to occur in a second section of a second electrode or a saturable absorption region.

According to a first embodiment to a fifth embodiment of the present disclosure, there is provided a laser diode device including a laminated structure in which a first compound semiconductor layer (active layer) that has a first conductivity type and is composed of GaN compound semiconductor, a third compound semiconductor layer that has a light emitting region and a saturable absorption region composed of GaN compound semiconductor, and a second compound semiconductor layer that has a second conductivity type different from the first conductivity type and is composed of GaN compound semiconductor are sequentially layered, a second electrode formed on the second compound semiconductor layer, and a first electrode electrically connected to the first compound semiconductor layer. The laminated structure has ridge stripe structure. The second electrode is separated into a first section to obtain forward bias state by applying a direct current to the first electrode through the light emitting region, and a second section to add electric field to the saturable absorption region by an isolation trench.

In the laser diode device according to the first embodiment of the present disclosure, $1<W_2/W_{MIN}$ is satisfied, $1.5 \leq W_2/W_{MIN} \leq 20$ is preferably satisfied, and $2.0 \leq W_2/W_{MIN} \leq 10$ is more preferably satisfied, where minimum width of the ridge stripe structure is $W_{MIN}$, and width of the ridge stripe structure of the second section of the second electrode in an interface between the second section of the second electrode and the isolation trench is $W_2$. In the case where $W_2/W_{MIN} \leq 20$ is satisfied, single mode is able to be securely retained. A portion of the ridge stripe structure having the minimum width $W_{MIN}$ may be located in the light emitting region, or may be located in the saturable absorption region. However, in the most preferable case, the portion of the ridge stripe structure having the minimum width $W_{MIN}$ is located in the end face of the laminated structure.

Further, in the laser diode device according to the second embodiment of the present disclosure, a second compound semiconductor layer exposed region in which the second compound semiconductor layer is exposed is provided on both sides of the ridge stripe structure, and $1<L_2/L_{1-ave}$ is satisfied, $1.1 \leq L_2/L_{1-ave} \leq 2.0$ is preferably satisfied, and $1.15 \leq L_2/L_{1-ave} \leq 1.25$ is more preferably satisfied, where average distance from a portion of the third compound semiconductor layer composing the light emitting region to a top face of the second compound semiconductor layer exposed region is $L_{1-ave}$, and distance from a portion of the third compound semiconductor layer composing the saturable absorption region to the top face of the second compound semiconductor layer exposed region is $L_2$ in interface between the second section of the second electrode and the isolation trench. Further, in the laser diode device according to the second embodiment of the present disclosure, $2.0 \leq D_2/D_{1-ave} \leq 3.5$ is preferably satisfied, where average width of the second compound semiconductor layer exposed region in the light emitting region along direction orthogonal to axis line direction of the ridge stripe structure is $D_{1-ave}$, and width of the second compound semiconductor layer exposed region in the saturable absorption region along the direction orthogonal to the axis line direction of the ridge stripe structure is $D_2$ in the interface between the second section of the second electrode and the isolation trench.

Further, in the laser diode device according to the third embodiment of the present disclosure, $H_2/H_{1-ave} < 1$ is satisfied, $0.85 \leq H_2/H_{1-ave} \leq 0.98$ is preferably satisfied, and $0.90 \leq H_2/H_{1-ave} \leq 0.95$ is more preferably satisfied, where average height of the ridge stripe structure in the light emitting region is $H_{1-ave}$, and height of the ridge stripe structure of the second section of the second electrode in interface between the second section of the second electrode and the isolation trench is $H_2$.

Further, in the laser diode device according to the fourth embodiment of the present disclosure, the second section of the second electrode is composed of a plurality of sections. As the number of the plurality of sections, 2 or 3 is able to be exemplified. In the case where the second section of the second electrode is composed of a plurality of sections, the second section of the second electrode may be separated into a plurality of sections by a second isolation trench.

Further, in the laser diode device according to the fifth embodiment of the present disclosure, a reducing section reducing light confinement effect is provided in a region on which electric field of the saturable absorption region is concentrated.

The reducing section reducing light confinement effect may be combined with, for example, the constituent feature of the laser diode device according to the first embodiment of the present disclosure. That is, the reducing section reducing light confinement effect is able to be embodied by satisfying $1 < W_2/W_{MIN}$, preferably satisfying $1.5 \leq W_2/W_{MIN} \leq 20$, and more preferably satisfying $2.0 \leq W_2/W_{MIN} \leq 10$ where the minimum width of the ridge stripe structure is $W_{MIN}$, and the width of the ridge stripe structure of the second section of the second electrode in the interface between the second section of the second electrode and the isolation trench is $W_2$. Further, the reducing section reducing light confinement effect may be combined with, for example, the constituent feature of the laser diode device according to the second embodiment of the present disclosure. That is, the reducing section reducing light confinement effect is able to be embodied by providing the second compound semiconductor layer exposed region in which the second compound semiconductor is exposed on both sides of the ridge stripe structure, and satisfying $1 < L_2/L_{1-ave}$, preferably satisfying $1.1 \leq L_2/L_{1-ave} \leq 2.0$, and more preferably satisfying $1.15 \leq L_2/L_{1-ave} \leq 1.25$ where the average distance from the portion of the third compound semiconductor layer composing the light emitting region to the top face of the second compound semiconductor layer exposed region is $L_{1-ave}$, and the distance from the section of the third compound semiconductor layer composing the saturable absorption region to the top face of the second compound semiconductor layer exposed region is $L_2$ in the interface between the second section of the second electrode and the isolation trench. Further, the reducing section reducing light confinement effect is able to be embodied by satisfying $2.0 \leq D_2/D_{1-ave} \leq 3.5$ where the average width of the second compound semiconductor layer exposed region in the light emitting region along the direction orthogonal to the axis line direction of the ridge stripe structure is $D_{1-ave}$, and the width of the second compound semiconductor layer exposed region in the saturable absorption region along the direction orthogonal to the axis line direction of the ridge stripe structure is $D_2$ in the interface between the second section of the second electrode and the isolation trench. Furthermore, the reducing section reducing light confinement effect may be combined with, for example, the constituent feature of the laser diode device according to the third embodiment of the present disclosure. That is, the reducing section reducing light confinement effect is able to be embodied by satisfying $H_2/H_{1-ave} < 1$, preferably satisfying $0.85 \leq H_2/H_{1-ave} \leq 0.98$, and more preferably satisfying $0.90 \leq H_2/H_{1-ave} \leq 0.95$ where the average height of the ridge stripe structure in the light emitting region is $H_{1-ave}$, and the height of the ridge stripe structure of the second section of the second electrode in the interface between the second section of the second electrode and the isolation trench is $H_2$. Moreover, the reducing section reducing light confinement effect may be combined with, for example, the constituent feature of the laser diode device according to the fourth embodiment of the present disclosure. That is, the reducing section reducing light confinement effect is able to be embodied by composing the second section of the second electrode of the plurality of sections. As the number of the plurality of sections, 2 or 3 is able to be exemplified.

As a result of examination of the inventors, it has been found that damage often occurs in the second section of the second electrode in the interface between the second section of the second electrode and the isolation trench (in some cases, hereinafter referred to as "interface region of the second section of the second electrode"). In the laser diode device according to the first embodiment of the present disclosure, since $1 < W_2/W_{MIN}$ is satisfied, electric field is less likely to concentrate on the interface region of the second section of the second electrode, and damage is less likely to occur in the second section of the second electrode. Further, $L_2/L_{1-ave} > 1$ is satisfied in the laser diode device according to the second embodiment of the present disclosure, and $H_2/H_{1-ave} < 1$ is satisfied in the laser diode device according to the third embodiment of the present disclosure. Thus, electric field concentration on a portion of the saturable absorption region corresponding to the interface region of the second section of the second electrode (in some cases, hereinafter referred to as "interface region of the saturable absorption region") is reduced, and damage is less likely to occur in the saturable absorption region. Further, in the laser diode device according to the fourth embodiment of the present disclosure, the second section of the second electrode is composed of the plurality of sections. Thus, heat generated in the second section of the second electrode is easily diffused, and accordingly damage is less likely to occur in the second section of the second electrode. Further, since the saturable absorption region is composed of the plurality of sections, electric field is less likely to concentrate on the interface region of the saturable absorption region, and damage is less likely to occur in the interface region of the saturable absorption region. In the laser diode device according to the fifth embodiment of the present disclosure, the reducing section reducing light confinement effect is provided in the region on which electric field of the saturable absorption region is concentrated. Thus, damage is less likely to occur in the interface region of the saturable absorption region.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIGS. 6A and 6B are schematic end views of the laser diode device of the second exemplified embodiment.

FIGS. 13A and 13B are schematic partial cross sectional views of a substrate and the like for explaining a manufacturing method of the laser diode device of the first exemplified embodiment.

FIGS. 14A and 14B are schematic partial cross sectional views of a substrate and the like for explaining the manufacturing method of the laser diode device of the first exemplified embodiment following FIG. 13B.

DETAILED DESCRIPTION

Figure 1A:
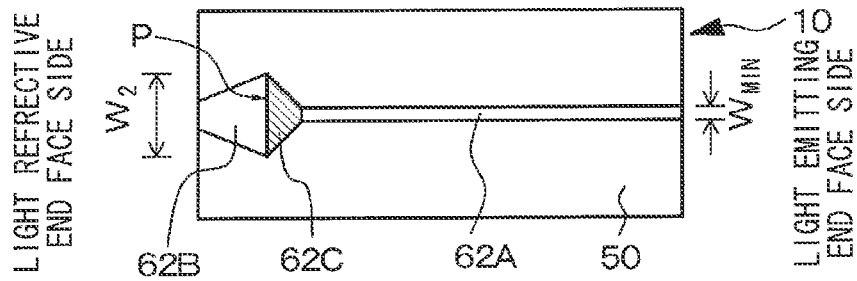
FIGS. 1A, 1B, and 1C are schematic plain views of a laser diode device of a first exemplified embodiment.

Embodiments of the present application will be described below in detail with reference to the drawings.

While the present disclosure will be hereinafter described based on embodiments with reference to the drawings, the present disclosure is not limited to the exemplified embodiments, and various numerical values and materials in the exemplified embodiments are exemplification. The description will be given in the following order:

1. Explanation of laser diode devices according to a first embodiment to a fifth embodiment of the present disclosure, and overall description 2. First exemplified embodiment (the laser diode devices according to the first embodiment and the fifth embodiment of the present disclosure)

3. Second exemplified embodiment (the laser diode devices according to the second embodiment, the third embodiment, and the fifth embodiment of the present disclosure)

4. Third exemplified embodiment (the laser diode devices according to the fourth embodiment and the fifth embodiment of the present disclosure) and others

[Explanation of Laser Diode Devices According to a First Embodiment to a Fifth Embodiment of the Present Disclosure, and Overall Description]

In laser diode devices according to a first embodiment to a fifth embodiment of the present disclosure, an electric resistance value between a first section and a second section of a second electrode is $1*10$ times or more, preferably $1*10^2$ or more, and more preferably $1*10^3$ or more as much as the electric resistance value between the second electrode and the first electrode. Further, the electric resistance value between the first section and the second section of the second electrode is desirably $1*10^2 \Omega$ or more, is preferably $1*10^3 \Omega$ or more, and is more preferably $1*10^4 \Omega$ or more.

In the laser diode device as described above, the electric resistance value between the first section and the second section of the second electrode is $1*10$ times or more as much as the electric resistance value between the second electrode and the first electrode, or is $1*10^2 \Omega$ or more. Thus, leakage current flow from the first section to the second section of the second electrode may be securely suppressed. That is, reverse bias voltage $V_{sa}$ applied to a saturable absorption region (carrier non-injection region) is allowed to be increased. Thus, single-mode-locking operation having light pulse with short duration may be attained. In addition, such a high electric resistance value between the first section and the second section of the second electrode may be attained only by separating the second electrode into the first section and the second section by an isolation trench.

Further, in the laser diode devices according to the first embodiment to the fifth embodiment of the present disclosure, though not limited, a third compound semiconductor layer may have a quantum well structure including a well layer and a barrier layer. The thickness of the well layer may be from 1 nm to 10 nm both inclusive, and may be preferably from 1 nm to 8 nm both inclusive. The impurity doping concentration of the barrier layer may be from $2*10^{18}$ cm$^{-3}$ to $1*10^{20}$ cm$^{-3}$ both inclusive, and may be preferably from $1*10^{19}$ cm$^{-3}$ to $1*10^{20}$ cm$^{-3}$ both inclusive.

As described above, in the case where the thickness of the well layer composing the third compound semiconductor layer is specified as a value from 1 nm to 10 nm both inclusive, and the impurity doping concentration of the barrier layer composing the third compound semiconductor layer is specified as a value from $2*10^{18}$ cm$^{-3}$ to $1*10^{20}$ cm$^{-3}$ both inclusive, that is, in the case where the thickness of the well layer is reduced and carrier of the third compound semiconductor layer is increased, influence of piezoelectric polarization may be decreased, and a laser light source capable of generating single-peaked light pulse that has a short duration and small subpulse component may be obtained. Further, mode-locking drive may be attained by low reverse bias voltage, and optical pulse train in synchronization with an external signal (electric signal and light signal) may be generated. Impurity doped in the barrier layer may be silicon (Si). However, doped impurity is not limited thereto, and other substance such as oxygen (O) may be used.

Further, in the laser diode devices according to the first embodiment to the fifth embodiment of the present disclosure, the width of the isolation trench that separates the second electrode into the first section and the second section is desirably 2 μm or more and 40% or less as much as the resonator length in the laser diode device (hereinafter simply referred to as "resonator length"), and is preferably 10 μm or more and 20% or less as much as the resonator length. As the resonator length, 0.6 mm may be exemplified. However, the value is not limited thereto.

Further, in the laser diode devices according to the first embodiment to the fifth embodiment of the present disclosure, laser light is preferably outputted from an end face (light emitting end face) of a laminated structure on a light emitting region side.

The laser diode devices according to the first embodiment to the fifth embodiment of the present disclosure including the foregoing preferred forms and the foregoing preferred configurations (in some cases, hereinafter simply and collectively referred to as "laser diode device of the present disclosure") may be a laser diode device having a ridge stripe-type separate confinement heterostructure (SCH). Further, the laser diode device of the present disclosure may be a laser diode device having an oblique ridge stripe-type separate confinement heterostructure. Further, in the laser diode device of the present disclosure, self-pulsation operation and mode-locking operation are enabled by obtaining forward bias state by flowing a direct current to the first electrode through the light emitting region from the first section of the second electrode and by adding electric field to the saturable absorption region by applying a voltage between the first electrode and the second section of the second electrode.

In the laser diode device of the present disclosure, the second electrode may be composed of a palladium (Pd) single layer, a nickel (Ni) single layer, a platinum (Pt) single layer, a laminated structure of a palladium layer and a platinum layer in which the palladium layer is contacted with a second compound semiconductor layer, or a laminated structure of a palladium layer and a nickel layer in which the palladium layer is contacted with the second compound semiconductor layer. In the case where the lower metal layer is composed of palladium and the upper metal layer is composed of nickel, the thickness of the upper metal layer is desirably 0.1 μm or more, and is preferably 0.2 μm or more. Further, the second electrode is preferably composed of the palladium (Pd) single layer. In this case, the thickness thereof is desirably 20 nm or more, and is preferably 50 nm or more. Further, the second electrode is preferably composed of a palladium (Pd) single layer, a nickel (Ni) single layer, a platinum (Pt) single layer, or a laminated structure of a lower metal layer and an upper metal layer in which the lower metal layer is contacted with the second compound semiconductor layer (however, the lower metal layer is composed of one metal selected from the group consisting of palladium, nickel, and platinum; and the upper metal layer is composed of a metal having etching rate in forming the isolation trench in the second electrode in the after-mentioned step D equal to, similar to, or higher than etching rate of the lower metal layer). Further, an etchant used in forming the isolation trench in the second electrode in the after-mentioned step D is desirably aqua regia, nitric acid, sulfuric acid, hydrochloric acid, or a mixed liquid composed of at least two types out of these acids (specifically, a mixed liquid composed of nitric acid and sulfuric acid, or a mixed liquid composed of sulfuric acid and hydrochloric acid).

In the laser diode device of the present disclosure, the length of the saturable absorption region may be shorter than the length of the light emitting region. Further, the length of the second electrode (total length of the first section and the second section) may be shorter than the length of the third compound semiconductor layer (active layer). Specific examples of arrangement state of the first section and the second section of the second electrode may include the following:

1. State in which one first section of the second electrode and one second section of the second electrode are provided, and the first section of the second electrode and the second section of the second electrode are arranged with an isolation trench in between, 2. State in which one first section of the second electrode and two second sections of the second electrode are provided, an end of the first section is opposed to one second section with one isolation trench in between, and the other end of the first section is opposed to the other second section with the other isolation trench in between, and 3. State in which two first sections of the second electrode and one second section of the second electrode are provided, an end of the second section is opposed to one first section with one isolation trench in between, and the other end of the second section is opposed to the other first section with the other isolation trench in between (that is, the second electrode has a structure in which the second section is sandwiched between the first sections). Further, more generally, examples of arrangement state of the first section and the second section of the second electrode include the following:

4. State that N pieces of the first sections of the second electrode and (N−1) pieces of the second sections of the second electrode are provided, and the second section of the second electrode is sandwiched between the first sections of the second electrode, and 5. State that N pieces of the second sections of the second electrode and (N−1) pieces of the first sections of the second electrode are provided, and the first section of the second electrode is sandwiched between the second sections of the second electrode.

In other words, the states 4 and 5 are described as follows:

4'. State that N pieces of light emitting regions [carrier injection region, gain region] and (N−1) pieces of saturable absorption regions [carrier non-injection region] are provided, and the saturable absorption region is sandwiched between the light emitting regions, and 5'. State that N pieces of saturable absorption regions [carrier non-injection region] and (N−1) pieces of light emitting regions [carrier injection region, gain region] are provided, and the light emitting region is sandwiched between the saturable absorption regions.

In the case where a plurality of second sections of the second electrode exist, it is enough that at least a second section of the second electrode located in a place closest to a light reflective end face of the laminated structure (end face on the opposite side of the light emitting end face of the laminated structure) satisfies specifications of $W_2/W_{MIN}$ of the laser diode device according to the first embodiment of the present disclosure, $L_2/L_{1\text{-}ave}$ of the laser diode device according to the second embodiment of the present disclosure, and $H_2/H_{1\text{-}ave}$ of the laser diode device according to the third embodiment of the present disclosure; and specification in which the second section of the second electrode of the laser diode device according to the fourth embodiment of the present disclosure is composed of a plurality of sections.

The laser diode device of the present disclosure may be manufactured, for example, by the following method though depending on the configuration and the structure of the laser diode device to be manufactured. That is, the laser diode device of the present disclosure may be manufactured, for example, by the following manufacturing method including the following respective steps:

step A. forming a laminated structure in which a first compound semiconductor layer that has first conductivity type and is composed of GaN compound semiconductor, the third compound semiconductor layer that has the light emitting region and the saturable absorption region composed of GaN compound semiconductor, and the second compound semiconductor layer that has second conductivity type different from the first conductivity type and is composed of GaN compound semiconductor are sequentially layered is formed on a substrate, step B. forming the second electrode on the second compound semiconductor layer, step C. etching part of the second compound semiconductor layer with the use of the second electrode as an etching mask, and thereby forming a ridge stripe structure, and step D. forming a resist layer to form the isolation trench in the second electrode, subsequently forming the isolation trench in the second electrode by wet etching method with the use of the resist layer as a wet etching mask, and thereby separating the second electrode into the first section and the second section by the isolation trench.

The ridge stripe structure is formed by adopting the foregoing manufacturing method, that is, by etching part of the second compound semiconductor layer with the use of the second electrode as an etching mask. In other words, the ridge stripe structure is formed by self alignment method by using the patterned second electrode as an etching mask. Thus, no joint misalignment occurs between the second electrode and the ridge stripe structure. Further, the isolation trench is preferably formed in the second electrode by wet etching method. By adopting wet etching method as described above, deterioration of the optical and electric characteristics of the second compound semiconductor layer may be inhibited differently from dry etching method. Accordingly, deterioration of light emitting characteristics may be securely prevented.

Though depending on the configuration and the structure of the laser diode device to be manufactured, in the step C, part of the second compound semiconductor layer may be etched in the thickness direction, all of the second compound semiconductor layer may be etched in the thickness direction, the second compound semiconductor layer and the third compound semiconductor layer may be etched in the thickness direction, or part of the second compound semiconductor layer, the third compound semiconductor layer, and the first compound semiconductor layer may be etched in the thickness direction.

Further, when etching rate of the second electrode is $Er_0$ and etching rate of the laminated structure is $Er_1$ in forming the isolation trench in the second electrode in the foregoing step D, $Er_0/Er_1 \geq 1*10$ is desirably satisfied, and $Er_0/Er_1 \geq 1*10^2$ is preferably satisfied. In the case where $Er_0/Er_1$ satisfies the foregoing relation, the second electrode is securely etched without etching the laminated structure (or if the laminated structure is etched, the etching portion is little.)

Further, in the laser diode device of the present disclosure, specifically, the laminated structure may be composed of AlGaInN compound semiconductor. Specific examples of AlGaInN compound semiconductor include GaN, AlGaN, GaInN, and AlGaInN. Further, such a compound semiconductor may include boron (B) atom, thallium (Tl) atom, arsenic (As) atom, phosphorus (P) atom, or antimony (Sb) atom according to needs. Further, the third compound semiconductor layer (active layer) structuring the light emitting region (gain region) and the saturable absorption region desirably has the quantum well structure. Specifically, the third compound semiconductor layer may have single quantum well structure [QW structure], or multiquantum well structure [MQW structure]. The third compound semiconductor layer (active layer) having the quantum well structure has a structure in which at least one well layer and at least one barrier layer are layered. As a combination of compound semiconductor composing the well layer and compound semiconductor composing the barrier layer, $(In_yGa_{(1-y)}N, GaN)$, $(In_yGa_{(1-y)}N, In_zGa_{(1-z)}N)$ [y>z], and $(In_yGa_{(1-y)}N, AlGaN)$ may be exemplified.

Further, in the laser diode device of the present disclosure, the second compound semiconductor layer may have a superlattice structure in which a p-type GaN layer and a p-type AlGaN layer are alternately layered. The thickness of the superlattice structure may be 0.7 μm or less. By adopting such a superlattice structure, while high refractive index necessary as a cladding layer is maintained, a series resistance component of the laser diode device is able to be decreased, leading to a low operation voltage of the laser diode device. Though the lower limit value of the thickness of the superlattice structure is not limited, the lower limit value is, for example, 0.3 μm. As the thickness of the p-type GaN layer composing the superlattice structure, a thickness from 1 nm to 5 nm both inclusive may be exemplified. As the thickness of the p-type AlGaN layer composing the superlattice structure, a thickness from 1 nm to 5 nm both inclusive may be exemplified. As the total number of layers of the p-type GaN layer and the p-type AlGaN layer, the number from 60 to 300 both inclusive may be exemplified. Further, the distance from the third compound semiconductor layer to the second electrode may be 1 μm or less, and preferably 0.6 μm or less. By defining the distance from the third compound semiconductor layer to the second electrode as described above, the thickness of the p-type second compound semiconductor layer having high resistance may be decreased, and the operation voltage of the laser diode device may be decreased. Though the lower limit value of the distance from the third compound semiconductor layer to the second electrode is not limited, for example, the lower limit value of the distance from the third compound semiconductor layer to the second electrode is 0.3 μm. Further, the second compound semiconductor layer may be doped with Mg at the level of $1*10^{19}$ cm$^{-3}$ or more. The absorption coefficient of the second compound semiconductor layer to light having 405 nm wavelength from the third compound semiconductor layer may be at least 50 cm$^{-1}$. The atom concentration of Mg comes from material property in which the maximum hole concentration is shown at the value of $2*10^{19}$ cm$^{-3}$, and is a result of design in which the maximum hole concentration, that is, the specific resistance of the second compound semiconductor layer becomes the minimum. The absorption coefficient of the second compound semiconductor layer is defined in terms of decreasing resistance of the laser diode device as much as possible. In the result, in general, the absorption coefficient of light of the third compound semiconductor layer becomes 50 $cm^{-1}$. However, it is possible that the Mg dope amount is intentionally set to the concentration of $2*10^{19}$ $cm^{-3}$ or more in order to increase the absorption coefficient. In this case, the upper limit of Mg dope amount for obtaining a practical hole concentration is, for example, $8*10^{19}$ $cm^{-3}$. Further, the second compound semiconductor layer may have a non-doped compound semiconductor layer and a p-type compound semiconductor layer from the third compound semiconductor layer side. The distance from the third compound semiconductor layer to the p-type compound semiconductor layer may be $1.2*10^{-7}$ m or less. By defining the distance from the third compound semiconductor layer to the p-type compound semiconductor layer as described above, internal loss may be suppressed in a range in which the internal quantum efficiency is not lowered. Thereby, threshold current density at which laser oscillation is started may be decreased. Though the lower limit value of the distance from the third compound semiconductor layer to the p-type compound semiconductor layer is not limited, for example, the lower limit value is $5*10^{-8}$ m. Further, on both side faces of the ridge stripe structure, a laminated insulating film composed of $SiO_2$/Si laminated structure may be formed. The difference between the effective refractive index of the ridge stripe structure and the effective refractive index of the laminated insulating film may be from $5*10^{-3}$ to $1*10^{-2}$ both inclusive. By using such a laminated insulating film, even in the case of high output operation exceeding 100 mW, single fundamental lateral mode may be maintained. Further, the second compound semiconductor layer may have a structure in which, for example, a non-doped GaInN layer (p-side light guide layer), a non-doped AlGaN layer (p-side cladding layer), a Mg doped AlGaN layer (electron barrier layer), a superlattice structure (superlattice cladding layer) composed of a GaN layer (Mg doped)/AlGaN layer, and a Mg doped GaN layer (p-side contact layer) are layered from the third compound semiconductor layer side. The bandgap of the compound semiconductor composing the well layer in the third compound semiconductor layer is desirably 2.4 eV or more. Further, the wavelength of laser light emitted from the third compound semiconductor layer (active layer) is desirably from 360 nm to 500 nm both inclusive, and is preferably from 400 nm to 410 nm both inclusive. It is needless to say that the foregoing various configurations may be combined as appropriate.

In the laser diode device of the present disclosure, various GaN compound semiconductor layers composing the laser diode device are sequentially formed over a substrate. Examples of the substrate may include a GaAs substrate, a GaN substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, a Si substrate, and a laminated body in which a foundation layer and a buffer layer are formed on the surface (main face) of the foregoing substrate in addition to a sapphire substrate. Mainly, in the case where the GaN compound semiconductor layer is formed on the substrate, the GaN substrate has the preference due to its small defect density. However, it is known that in the GaN substrate, its characteristics are changed from/to polarity, non-polarity, and semi-polarity according to the growth plane. Further, examples of methods of forming the various GaN compound semiconductor layer composing the laser diode device may include metal organic chemical vapor deposition method (MOCVD method and MOVPE method), molecular beam epitaxy method (MBE method), hydride vapor growth method in which halogen contributes to transfer or reaction, and the like.

Examples of organic gallium source gas in MOCVD method may include trimethyl gallium (TMG) gas and triethyl gallium (TEG) gas. Examples of nitrogen source gas may include ammonia gas and hydrazine gas. In forming the GaN compound semiconductor layer having n-type conductivity type, for example, silicon (Si) may be added as n-type impurity (n-type dopant). In forming the GaN compound semiconductor layer having p-type conductivity type, for example, magnesium (Mg) may be added as p-type impurity (p-type dopant). Further, in the case where aluminum (Al) or indium (In) is contained as a component atom of the GaN compound semiconductor layer, trimethyl aluminum (TMA) gas may be used as an Al source, and trimethyl indium (TMI) gas may be used as an In source. Further, monosilane gas ($SiH_4$ gas) may be used as a Si source, and ciclopentadienyl magnesium gas, methylciclopentadienyl magnesium, or bis-ciclopentadienyl magnesium ($Cp_2Mg$) may be used as a Mg source. Examples of n-type impurity (n-type dopant) may include Ge, Se, Sn, C, Te, S, O, Pd, and Po in addition to Si. Examples of p-type impurity (p-type dopant) may include Zn, Cd, Be, Ca, Ba, C, Hg, and Sr in addition to Mg.

When the first conductive type is n type, the first electrode electrically connected to the first compound semiconductor layer having n-type conductivity type desirably has a single layer structure or a multilayer structure containing at least one metal selected from the group consisting of gold (Au), silver (Ag), palladium (Pd), Al (aluminum), Ti (titanium), tungsten (W), Cu (copper), Zn (zinc), tin (Sn) and indium (In), and for example, Ti/Au, Ti/Al, and Ti/Pt/Au may be exemplified. The first electrode is electrically connected to the first compound semiconductor layer. The first electrode may be formed on the first compound semiconductor layer, and the first electrode may be connected to the first compound semiconductor layer with a conductive material layer or a conducive substrate in between. The first electrode and the second electrode may be formed by PVD method such as vacuum evaporation method and sputtering method.

A pad electrode may be provided on the first electrode and the second electrode in order to obtain electrical connection to an external electrode or a circuit. The pad electrode desirably has a single layer structure or a multilayer structure containing at least one metal selected from the group consisting of Ti (titanium), aluminum (Al), Pt (platinum), Au (gold), and Ni (nickel). Otherwise, the pad electrode may have a multilayer structure exemplified as a Ti/Pt/Au multilayer structure and a Ti/Au multilayer structure.

In the laser diode device of the present disclosure, as described above, the reverse bias voltage is desirably applied between the first electrode and the second section of the second electrode (that is, the first electrode is a cathode and the second section is an anode). A pulse current or a pulse voltage in synchronization with a pulse current or a pulse voltage applied to the first section of the second electrode may be applied to the second section of the second electrode. Direct current bias may be applied to the second section of the second electrode. Further, a current may be flown from the second electrode to the first electrode through the light emitting region, and an external electric signal may be superimposed on the first electrode from the second electrode through the light emitting region. Thereby, laser light may be in synchronization with the external electric signal. Further, a light signal may enter from one end face of the laminated structure.

Again, thereby the laser light may be in synchronization with the light signal. Moreover, in the second compound semiconductor layer, a non-doped compound semiconductor layer (for example, a non-doped GaInN layer or a non-doped AlGaN layer) may be formed between the third compound semiconductor layer and the electron barrier layer. Further, a non-doped GaInN layer as a light guide layer may be formed between the third compound semiconductor layer and the non-doped compound semiconductor layer. The uppermost layer of the second compound semiconductor layer may be occupied by a Mg doped GaN layer (p-side contact layer).

The laser diode device of the present disclosure is applicable to various fields such as the optical disc system, the communication field, the optical information field, the photoelectronic integrated circuit, the field applying nonlinear optical phenomenon, the optical switch, the laser measurement field and various analysis fields, the ultrafast spectroscopy field, the multiphoton excitation spectroscopy field, the mass analysis field, the microspectroscopic field using multiphoton absorption, quantum control of chemical reaction, the nano three-dimensional processing field, various processing fields applying multiphoton absorption, the medical field, and the bio imaging field.

First Exemplified Embodiment

Figure 3:
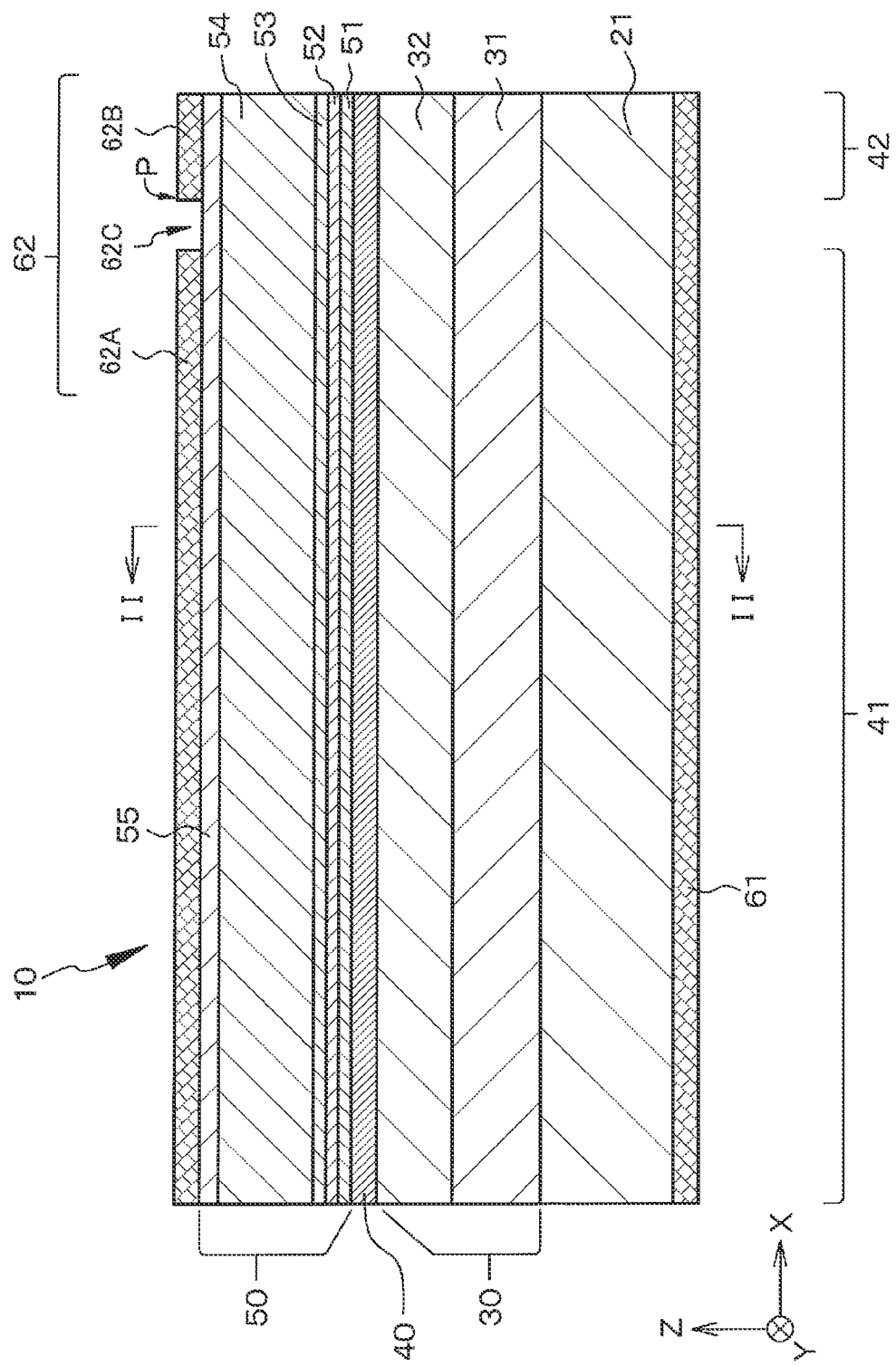
FIG. 3 is a schematic end view along direction in which a resonator of the laser diode device in the first exemplified embodiment extends (schematic end view cut along XZ plane).
Figure 4:
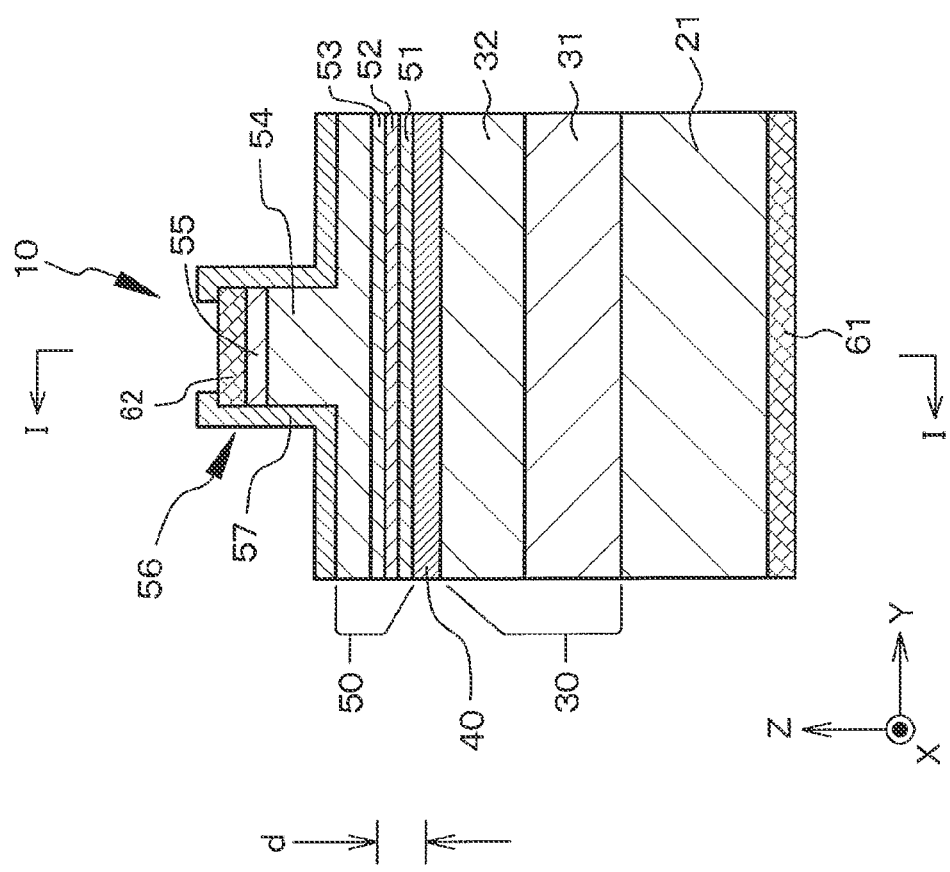
FIG. 4 is a schematic cross sectional view along direction perpendicular to the direction in which the resonator of the laser diode device in the first exemplified embodiment extends (schematic cross sectional view cut along YZ plane).

The first exemplified embodiment relates to the laser diode devices according to the first embodiment and the fifth embodiment of the present disclosure. FIGS. 1A to 1C and FIGS. 2A to 2C illustrate schematic plain views of a laser diode device of a first exemplified embodiment. Further, FIG. 3 illustrates a schematic end view along direction in which a resonator of the laser diode device in the first exemplified embodiment extends (schematic end view cut along XZ plane). FIG. 4 illustrates a schematic cross sectional view along direction perpendicular to the direction in which the resonator extends (schematic cross sectional view cut along YZ plane). FIG. 3 is a schematic end view taken along line I-I of FIG. 4. FIG. 4 is a schematic cross sectional view taken along line II-II of FIG. 3.

The laser diode device in the first exemplified embodiment or a laser diode device in second and third exemplified embodiments described later (in some cases, hereinafter collectively referred to as "laser diode device of the first exemplified embodiment and the like") is composed of a bi-section type laser diode device. The laser diode device includes a laminated structure in which a first compound semiconductor layer 30 that has a first conductivity type (in the respective exemplified embodiments, specifically, n-type conductivity type) and is composed of GaN compound semiconductor, a third compound semiconductor layer (active layer) 40 that has a light emitting region (gain region) 41 and a saturable absorption region 42 composed of GaN compound semiconductor, and a second compound semiconductor layer 50 that has a second conductivity type different from the first conductivity type (in the respective exemplified embodiments, specifically, p-type conductivity type) and is composed of GaN compound semiconductor are sequentially layered, a second electrode 62 formed on the second compound semiconductor layer 50, and a first electrode 61 electrically connected to the first compound semiconductor layer 30. The second electrode 62 is separated into a first section 62A to obtain forward bias state by flowing a direct current to the first electrode 61 through the light emitting region (gain region) 41 and a second section 62B to add electric field to the saturable absorption region 42 by an isolation trench 62C.

The laminated structure has a ridge stripe structure 56. Specifically, the laminated structure is a laser diode device having a ridge stripe type separate confinement heterostructure (SCH). More specifically, the laser diode device is a GaN laser diode device composed of index guide type AlGaInN developed for a Blu-ray optical disc system. The first compound semiconductor layer 30, the third compound semiconductor layer 40, and the second compound semiconductor layer 50 are specifically composed of AlGaInN compound semiconductor, and more specifically has the layer structure illustrated in Table 1 described below in the laser diode device of the first exemplified embodiment and the like. In Table 1, the listed items are illustrated in the order from the layer farthest from an n-type GaN substrate 21 to the layer closest to the n-type GaN substrate 21. Band gap of the compound semiconductor composing the well layer in the third compound semiconductor layer 40 is 3.06 eV. The laser diode device in the first exemplified embodiment and the like is provided on (0001) plane of the n-type GaN substrate 21. The third compound semiconductor layer 40 has a quantum well structure. The (0001) plane of the n-type GaN substrate 21 is also called "C plane," and is a crystal plane having polarity.

TABLE 1

| Second compound semiconductor layer 50 |
|---|
| p-type GaN contact layer (Mg doped) 55 |
| p-type GaN (Mg doped)/AlGaN superlattice cladding layer 54 |
| p-type AlGaN electron barrier layer (Mg doped) 53 |
| Non-doped AlGaN cladding layer 52 |
| Non-doped GaInN light guide layer 51 |
| Third compound semiconductor layer 40 |
| GaInN quantum well active layer |
| (well layer: $Ga_{0.92}In_{0.08}N$/barrier layer: $Ga_{0.98}In_{0.02}N$) |
| First compound semiconductor layer 30 |
| n-type GaN cladding layer 32 |
| n-type AlGaN cladding layer 31 |
| where |
| well layer (two layers): 10.5 nm non-doped |
| barrier layer (three layers): 14 nm non-doped |

Further, part of the p-type GaN contact layer 55 and part of the p-type GaN/AlGaN superlattice cladding layer 54 are removed by RIE method, and ridge stripe structure 56 is formed. On both sides of the ridge structure 56, a laminated insulating film 57 composed of $SiO_2$/Si is formed. The $SiO_2$ layer is the lower layer and the Si layer is the upper layer. The difference between the effective refractive index of the ridge stripe structure 56 and the effective refractive index of the laminated insulating film 57 is from $5*10^{-3}$ to $1*10^{-2}$ both inclusive, and is specifically $7*10^{-3}$. On the p-type GaN contact layer 55 corresponding to the top face of the ridge stripe structure 56, the second electrode (p-side ohmic electrode) 62 is formed. Meanwhile, on the rear face of the n-type GaN substrate 21, the first electrode (n-side ohmic electrode) 61 composed of Ti/Pt/Au is formed.

In the laser diode device of the first exemplified embodiment and the like, the p-type AlGaN electron barrier layer 53, the p-type GaN/AlGaN superlattice cladding layer 54, and the p-type GaN contact layer 55 that are Mg-doped compound semiconductor layers are arranged not to overlap with each other as much as possible in the light density distribution generated from the third compound semiconductor layer 40 and regions in the vicinity thereof. Thereby, internal loss is suppressed in a range in which internal quantum efficiency is not lowered. Therefore, threshold current density at which laser oscillation is started is decreased. Specifically, the distance d from the third compound semiconductor layer 40 to the p-type AlGaN electron barrier layer 53 was set to 0.10 µm, the height of the ridge stripe structure 56 was set to 0.30 µm, the thickness of the second compound semiconductor layer 50 located between the second electrode 62 and the third compound semiconductor layer 40 was set to 0.50 µm, and the thickness of a portion of the p-type GaN/AlGaN superlattice cladding layer 54 located below the second electrode 62 was set to 0.40 µm.

In the laser diode device of the first exemplified embodiment and the like, the second electrode 62 is separated into the first section 62A to obtain forward bias state by flowing a direct current to the first electrode 61 through the light emitting region (gain region) 41 and the second section 62B to add electric field to the saturable absorption region 42 (the second section 62B to add reverse bias voltage $V_{sa}$ to the saturable absorption region 42) by the isolation trench 62C. The electric resistance value (also referred to as "separating resistance value") between the first section 62A and the second section 62B of the second electrode 62 is 1*10 times or more as much as the electric resistance value between the second electrode 62 and the first electrode 61, and is specifically 1.5*10³ times as much as the electric resistance value between the second electrode 62 and the first electrode 61. Further, the electric resistance value (separating resistance value) between the first section 62A and the second section 62B of the second electrode 62 is 1*10²Ω or more, and is specifically 1.5*10⁴Ω.

In the laser diode device of the first exemplified embodiment and the like, laser light is emitted from the end face of the laminated structure (light emitting end face) on the light emitting region side. On the light emitting end face, for example, an absent reflex coating layer (AR) with reflectance of 0.5% or less, and preferably with reflectance of 0.3% or less, or a low reflective coating layer is formed. Meanwhile, on the light reflective end face opposed to the light emitting end face in the laser diode device 10, a high reflective coating layer (HR) with reflectance of 85% or more, and preferably with reflectance of 95% or more is formed. The absent reflex coating layer (AR), the low reflective coating layer, and the high reflective coating layer (HR) are not illustrated in the figures. The saturable absorption region 42 is provided on the light reflective end face side opposed to the light emitting end face in the laser diode device 10. Examples of the absent reflex coating layer or the low reflective coating layer include a laminated structure composed of at least two types of layers selected from the group consisting of a titanium oxide layer, a tantalum oxide layer, a zirconia oxide layer, a silicon oxide layer, and an aluminum oxide layer.

As described above, the second electrode 62 having a separating resistance value of 1*10²Ω or more is desirably formed on the second compound semiconductor layer 50. In the case of the GaN laser diode device, mobility in the compound semiconductor having p-type conductivity type is small differently from in the existing GaAs laser diode device. Thus, it is possible that the electric resistance value between the first section 62A and the second section 62B of the second electrode 62 becomes 10 times or more as much as the electric resistance value between the second electrode 62 and the first electrode 61, or the electric resistance value between the first section 62A and the second section 62B of the second electrode 62 becomes 1*10²Ω or more without setting high resistance of the second compound semiconductor layer 50 having p-type conductivity type by ion implantation or the like but by separating the second electrode 62 formed thereon by the isolation trench 62C.

In the laser diode device 10 of the first exemplified embodiment, $1<W_2/W_{MIN}$ is satisfied, $1.5 \leq W_2/W_{MIN} \leq 20$ is prefer- ably satisfied, and $2.0 \leq W_2/W_{MIN} \leq 10$ is more preferably satisfied, where the minimum width of the ridge stripe structure 56 is $W_{MIN}$, and the width of the ridge stripe structure 56 of the second section 62B of the second electrode 62 in the interface between the second section 62B of the second electrode 62 and the isolation trench 62C is $W_2$.

Further, in the laser diode device 10 of the first exemplified embodiment, a reducing section reducing light confinement effect is provided in a region on which electric field of the saturable absorption region 42 is concentrated. Specifically, the reducing section is embodied by $1<W_2/W_{MIN}$, where the minimum width of the ridge stripe structure 56 is $W_{MIN}$, and the width of the ridge stripe structure 56 of the second section 62B of the second electrode 62 in the interface between the second section 62B of the second electrode 62 and the isolation trench 62C is $W_2$.

In the laser diode device 10 whose schematic plain view is illustrated in FIG. 1A, the width of the first section 62A of the second electrode 62 is equal to the minimum width $W_{MIN}$ (constant value). Further, the width of the second section 62B of the second electrode 62 is widest in the interface region of the second section 62B of the second electrode 62 (indicated by arrow "P" in the figures, referred to as "interface region P" in some cases, and the same goes for the following description), is $W_2$, and the width is gradually narrowed toward the light reflective end face. In FIGS. 1A to 1C, FIGS. 2A to 2C, FIG. 5A, FIG. 8, and FIG. 12, the isolation trench region is shaded to clearly specify the isolation trench.

Figure 1B:
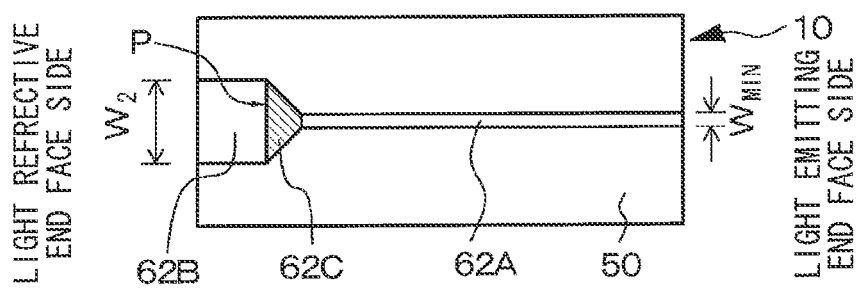

In the laser diode device 10 whose schematic plain view is illustrated in FIG. 1B, the width of the first section 62A of the second electrode 62 is equal to the minimum width $W_{MIN}$ (constant value). Further, the width of the second section 62B of the second electrode 62 is the constant value $W_2$ from the interface region P of the second section 62B of the second electrode 62 toward the light reflective end face.

Figure 1C:
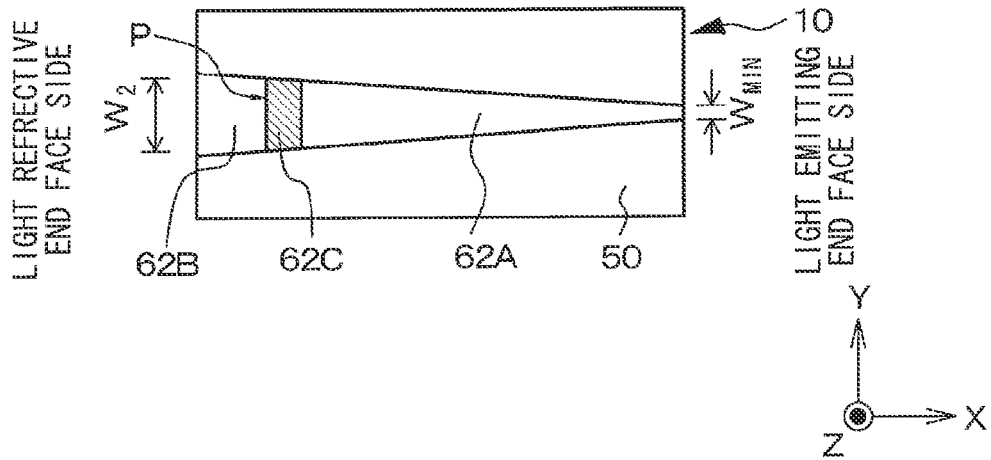

In the laser diode device 10 whose schematic plain view is illustrated in FIG. 1C, the width of the first section 62A of the second electrode 62 is the minimum width $W_{MIN}$ in the light emitting end face, and is broadened toward the light reflective end face. Further, the width of the second section 62B of the second electrode 62 is broadened from the interface region P of the second section 62B of the second electrode 62 toward the light reflective end face, and the width in the interface region P is $W_2$.

Figure 2A:
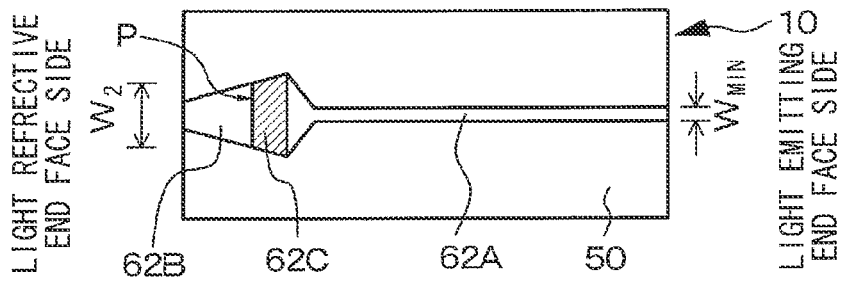
FIGS. 2A, 2B, and 2C are schematic plain views of the laser diode device of the first exemplified embodiment.

In the laser diode device 10 whose schematic plain view is illustrated in FIG. 2A, the width of the first section 62A of the second electrode 62 has a region equal to the minimum width $W_{MIN}$ (constant value). Further, the width of the first section 62A of the second electrode 62 is broadened in the vicinity of the isolation trench 62C. Further, the width of the second section 62B of the second electrode 62 is widest in the interface region P of the second section 62B of the second electrode 62, is $W_2$, and is gradually narrowed toward the light reflective end face.

Figure 2B:
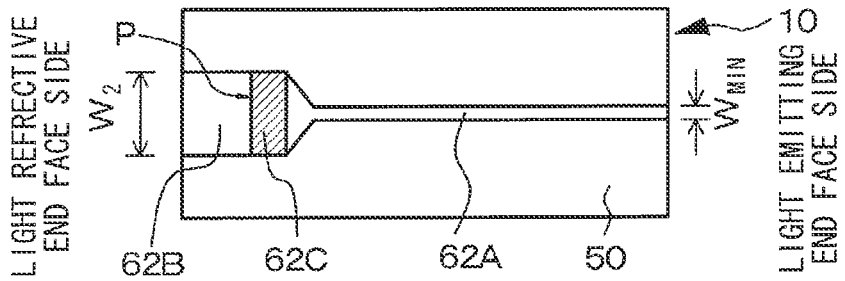

In the laser diode device 10 whose schematic plain view is illustrated in FIG. 2B, the width of the first section 62A of the second electrode 62 has a region equal to the minimum width $W_{MIN}$ (constant value). Further, the width of the first section 62A of the second electrode 62 is broadened in the vicinity of the isolation trench 62C. Further, the width of the second section 62B of the second electrode 62 is the constant value $W_2$ from the interface region P of the second section 62B of the second electrode 62 toward the light reflective end face.

Figure 2C:
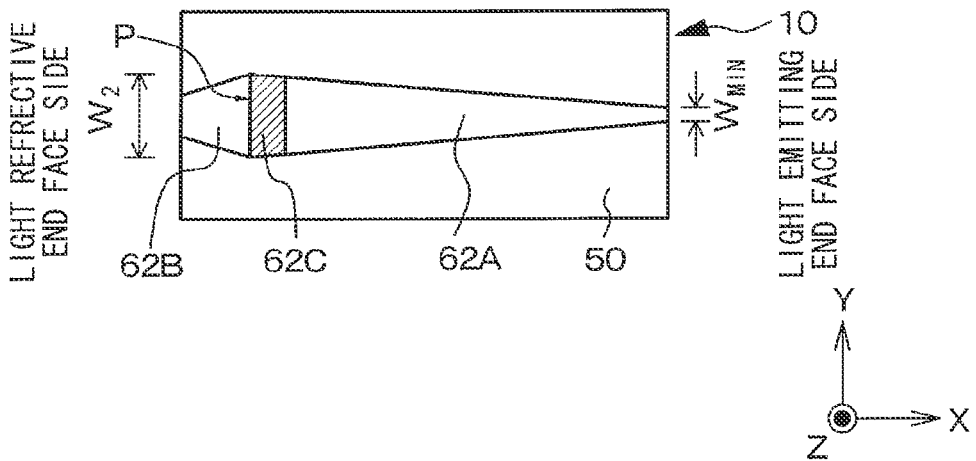

In the laser diode device 10 whose schematic plain view is illustrated in FIG. 2C, the width of the first section 62A of the second electrode 62 is the minimum width $W_{MIN}$ in the light emitting end face, and is broadened toward the light reflective end face. Further, the width of the second section 62B of the second electrode 62 is widest in the interface region P of the second section 62B of the second electrode 62, is $W_2$, and is gradually narrowed toward the light reflective end face.

In the laser diode device 10 of the first exemplified embodiment described above, the portion of the ridge stripe structure 56 having the minimum width $W_{MIN}$ is located in the light emitting region 41, and is located in the light emitting end face of the laminated structure.

As described above, in the laser diode device 10 of the first exemplified embodiment, $W_2/W_{MIN}>1$ is satisfied. Thus, electric field is less likely to concentrate on the interface region P of the second section 62B of the second electrode 62, and damage is less likely to occur in the second section 62B of the second electrode 62. In addition, electric field is less likely to concentrate on the interface region of the saturable absorption region. In the result, light density is able to be decreased, and damage is less likely to occur in the interface region of the saturable absorption region 42. The planar shape of the first section 62A and the second section 62B of the second electrode 62 is not limited to the examples illustrated in FIGS. 1A to 1C and FIGS. 2A to 2C.

For example, in the laser diode devices illustrated in FIG. 2C (referred to as "laser diode devices of Exemplified embodiment 1A and Exemplified embodiment 1B" for convenience), the resonator length of the laser diode device 10 was 600 μm, respective lengths of the first section 62A, the second section 62B, and the isolation trench 62C of the second electrode 62 were 560 μm, 30 μm, and 10 μm, $W_{1-MIN}$ was 1.5 μm, and $W_2$ was 2.5 μm (Exemplified embodiment 1A) or 5.0 μm (Exemplified embodiment 1B).

Meanwhile, a laser diode device in which the width of the first section 62A and the second section 62B of the second electrode 62 was constant value (1.5 μm) was fabricated as Comparative example 1.

Current $I_g$ flown to the light emitting region (gain region) 41 was increased, the voltage value $V_{sa}$ applied to the saturable absorption region 42 was increased, and thereby mode-locking operation was performed. Current value $I_{sa}$ flown to the saturable absorption region 42 at the time of damage generation in the laser diode devices of Exemplified embodiment 1A, Exemplified embodiment 1B, and Comparative example 1 was measured. The current value $I_{sa}$ is able to be regarded as light amount inserted into the saturable absorption region 42. If deterioration due to electric field concentration is able to be modified, the current $I_g$ and the voltage value $V_{sa}$ are able to be increased, and thus the current value $I_{sa}$ is able to be possibly increased. The result was as follows. From the result, it is found that as the value of $W_2$ is increased, a current value capable of being flown to the saturable absorption region 42 (light amount which is able to be absorbed into the saturable absorption region 42) is able to be increased. In other words, it is found that electric field is less likely to concentrate on the interface region of the saturable absorption region 42.

Exemplified embodiment 1A: 14 milliampere
Exemplified embodiment 1B: 25 milliampere
Comparative example 1: 10 milliampere
Requested characteristics of the second electrode 62 are as follows:

1. A function as an etching mask in etching the second compound semiconductor layer 50 is included,
2. The second electrode 62 is able to be wet-etched without deteriorating optical and electric characteristics of the second compound semiconductor layer 50,
3. Contact specific resistance value of $10^{-2}$ Ω·cm² or less is shown in the case where the second electrode 62 is formed on the second compound semiconductor layer 50,
4. In the case of a laminated structure, a material composing the lower metal layer has large work function, shows low contact specific resistance value to the second compound semiconductor layer 50, and is able to be wet-etched, and
5. In the case of a laminated structure, a material composing the upper metal layer has resistance to etching in forming the ridge stripe structure (for example, $Cl_2$ gas used in RIE method), and is able to be wet-etched.

In the laser diode device of the first exemplified embodiment and the like, the second electrode 62 was formed from a Pd single layer having a thickness of 0.1 μm.

The thickness of the p-type GaN/AlGaN superlattice cladding layer 54 having a superlattice structure in which a p-type GaN layer and a p-type AlGaN layer are alternately layered is 0.7 μm or less, and specifically 0.4 μm. The thickness of the p-type GaN layer composing the superlattice structure is 2.5 nm. The thickness of the p-type AlGaN layer composing the superlattice structure is 2.5 nm. The total number of layers of the p-type GaN layer and the p-type AlGaN layer is 160. Further, the distance from the third compound semiconductor layer 40 to the second electrode 62 is 1 μm or less, and specifically 0.5 μm. Further, the p-type AlGaN electron barrier layer 53, the p-type GaN/AlGaN superlattice cladding layer 54, and the p-type GaN contact layer 55 composing the second compound semiconductor layer 50 are doped with Mg at the level of $1*10^{19}$ cm⁻³ or more (specifically at the level of $2*10^{19}$ cm⁻³). The absorption coefficient of the second compound semiconductor layer 50 to light with 405 nm wavelength is at least 50 cm⁻¹, and specifically 65 cm⁻¹. Further, the second compound semiconductor layer 50 is provided with the non-doped compound semiconductor layer (the non-doped GaInN light guide layer 51 and the non-doped AlGaN cladding layer 52) and the p-type compound semiconductor layer from the third compound semiconductor layer 40 side. The distance d from the third compound semiconductor layer 40 to the p-type compound semiconductor layer (specifically, the p-type AlGaN electron barrier layer 53) is $1.2*10^{-7}$ m or less, and specifically 100 nm.

Figure 15:
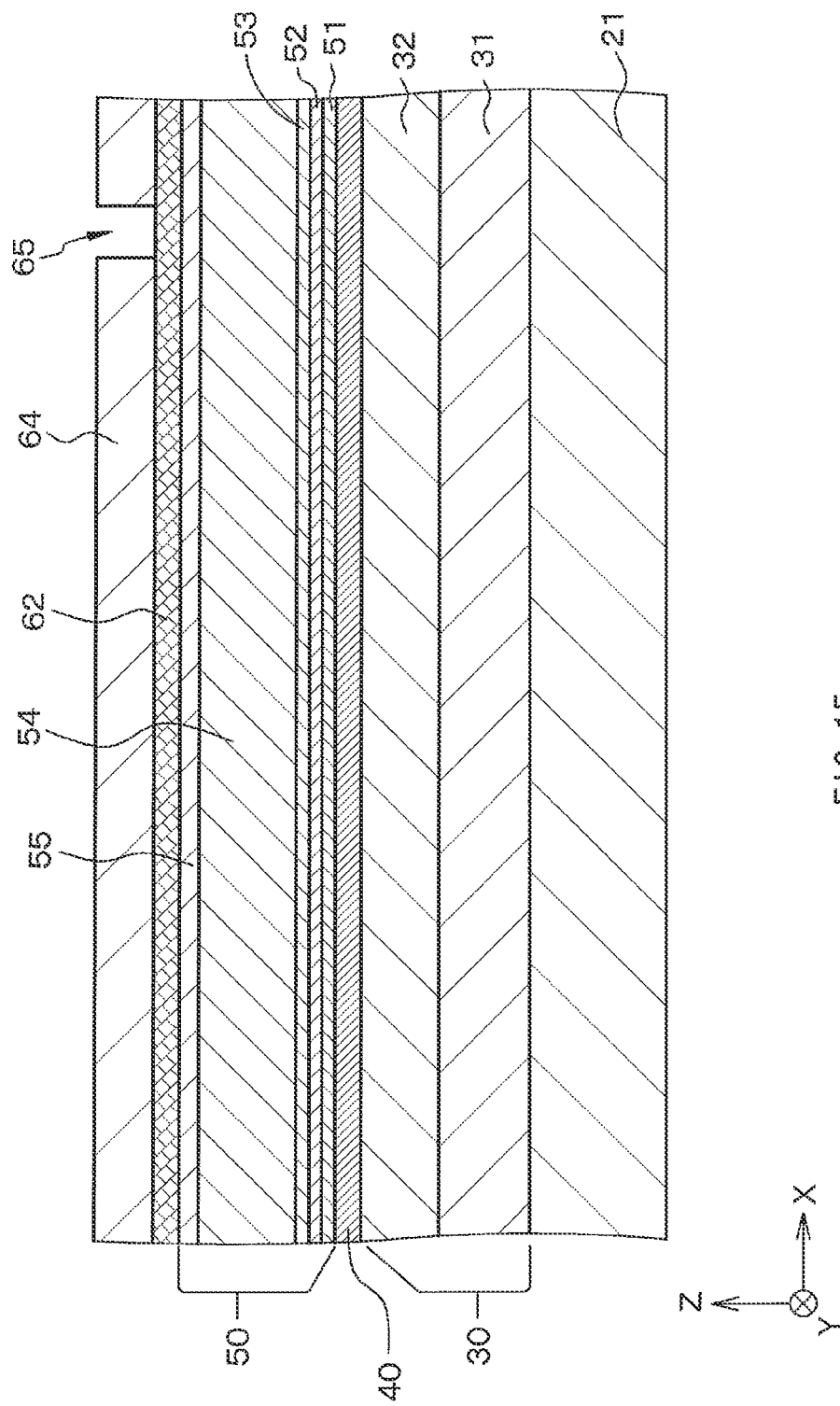
FIG. 15 is a schematic partial end view of the substrate and the like for explaining the manufacturing method of the laser diode device of the first exemplified embodiment following FIG. 14B.

A description will be given of a method of manufacturing the laser diode device in the first exemplified embodiment with reference to FIGS. 13A, 13B, 14A, 14B, and 15. FIGS. 13A, 13B, 14A, and 14B are schematic partial cross sectional views where the substrate and the like are cut in YZ plane. FIG. 15 is a schematic partial end view where the substrate and the like are cut in XZ plane.

[Step-100]

First, a laminated structure in which the first compound semiconductor layer 30 that has first conductivity type (n-type conductivity type) and is composed of GaN compound semiconductor, the third compound semiconductor layer (active layer 40) including the light emitting region (gain region) 41 and the saturable absorption region 42 composed of GaN compound semiconductor, and the second compound semiconductor layer 50 that has second conductivity type (p-type conductivity type) different from the first conductivity type and is composed of GaN compound semiconductor are sequentially layered is formed on a substrate, specifically on (0001) plane of the n-type GaN substrate 21 based on known MOCVD method (refer to FIG. 13A).

[Step-110]

After that, the second electrode 62 is formed on the second compound semiconductor layer 50. Specifically, after a Pd layer 63 is formed over the entire face of the second compound semiconductor layer 50 based on vacuum evaporation method (see FIG. 13B), an etching-use resist layer is formed on the Pd layer 63 based on photolithography technique. After the Pd layer 63 not covered with the etching-use resist layer is removed by using aqua regia, the etching-use resist layer is removed. Thereby, the structure illustrated in FIG. 14A is able to be obtained. It is possible that the second electrode 62 is formed on the second compound semiconductor layer 50 based on liftoff method.

[Step-120]

Next, at least part of the second compound semiconductor layer 50 is etched with the use of the second electrode 62 as an etching-use mask to form the ridge stripe structure 56. Specifically, part of the second compound semiconductor layer 50 is etched with the use of the second electrode 62 as an etching-use mask based on RIE method using $Cl_2$ gas. Thereby, the structure illustrated in FIG. 14B is able to be obtained. As described above, the ridge stripe structure 56 is formed by self alignment method by using the patterned second electrode 62 as an etching-use mask. Thus, misalignment is not generated between the second electrode 62 and the ridge stripe structure 56.

[Step-130]

After that, a resist layer 64 to form the isolation trench in the second electrode 62 is formed (refer to FIG. 15). Referential number 65 represents an aperture provided in the resist layer 64 to form the isolation trench. Next, the isolation trench 62C is formed in the second electrode 62 by wet etching method with the use of the resist layer 64 as a wet etching-use mask, and thereby the second electrode 62 is separated into the first section 62A and the second section 62B by the isolation trench 62C. Specifically, aqua regia is used as an etching liquid, and the entire body is dipped into the aqua regia for about 10 seconds, and thereby the isolation trench 62C is formed in the second electrode 62. After that, the resist layer 64 is removed. Accordingly, the structure illustrated in FIG. 3 and FIG. 4 is able to be obtained. As described above, differently from dry etching method, by adopting wet etching method, optical characteristics and electric characteristics of the second compound semiconductor layer 50 do not deteriorate. Thus, light emitting characteristics of the laser diode device are not deteriorated. If dry etching method is adopted, there is a possibility that internal loss $\alpha_i$ of the second compound semiconductor layer 50 increases, the threshold voltage increases, and light output is lowered. In this case, $ER_0/ER_1 \approx 1*10^2$, where an etching rate of the second electrode 62 is $ER_0$, and an etching rate of the laminated structure is $ER_1$, is established:

As described above, since the high etching selection ratio exists between the second electrode 62 and the second compound semiconductor layer 50, the second electrode 62 is allowed to be surely etched without etching the laminated structure (or even if the laminated structure is etched, the etching amount is small). $Er_0/Er_1 \geq 1*10$ is desirably satisfied, and $Er_0/Er_1 \geq 1*10^2$ is preferably satisfied.

The second electrode 62 may have a laminated structure composed of a lower metal layer made of palladium (Pd) having a thickness of 20 nm and an upper metal layer made of nickel (Ni) having a thickness of 200 nm. In wet etching with the use of aqua regia, nickel etching rate is about 1.25 times as much as palladium etching rate.

[Step-140]

After that, the n-side electrode is formed and the substrate is cleaved. Further, packaging is made, and thereby the laser diode device 10 is able to be formed.

In general, resistance R (Ω) of a semiconductor layer is expressed as follows by using specific resistance value ρ (Ω·m) of a material composing the semiconductor layer, length $X_0$ (m) of the semiconductor layer cross sectional area S ($m^2$) of the semiconductor layer, carrier density n ($cm^{-3}$), electric charge amount e (C), and mobility μ ($m^2$/V sec).

$$R=(\rho \cdot X_0)/S=X_0/(n \cdot e \cdot \mu \cdot S)$$

Since mobility of the p-type GaN semiconductor is two-digit or more smaller than that of the p-type GaAs semiconductor, the electric resistance value is easily increased. Thus, it is found that the electric resistance value of the laser diode device having a ridge stripe structure with a small cross sectional area becomes a large value based on the foregoing formula.

An electric resistance value between the first section 62A and the second section 62B of the second electrode 62 of the fabricated laser diode device 10 was measured by four terminal method. In the case where the width of the isolation trench 62C was 20 μm, the electric resistance value between the first section 62A and the second section 62B of the second electrode 62 was 15 kΩ. Further, in the fabricated laser diode device 10, forward bias state was obtained by flowing a direct current from the first section 62A of the second electrode 62 to the first electrode 61 through the light emitting region 41, and electric field was added to the saturable absorption region 42 by applying the reverse bias voltage $V_{sa}$ between the first electrode 61 and the second section 62B of the second electrode 62, and thereby self pulsation operation was allowed to be performed. That is, the electric resistance value between the first section 62A and the second section 62B of the second electrode 62 was ten times or more as large as the electric resistance value between the second electrode 62 and the first electrode 61, or $1*10^2 \Omega$ or more. Thus, flow of leakage current from the first section 62A of the second electrode 62 to the second section 62B of the second electrode 62 was able to be inhibited securely. In the result, the light emitting region 41 was able to be in forward bias state, the saturable absorption region 42 was securely able to be in reverse bias state, and single mode self pulsation operation was able to be securely performed. Specifically, the pulse width of light pulse was 30 picosecond, and the pulse peak power estimated based on time average power (64 milliwatt/sec, about 72 picojoule/pulse) was about 2.4 watt.

Second Exemplified Embodiment

Figure 5A:
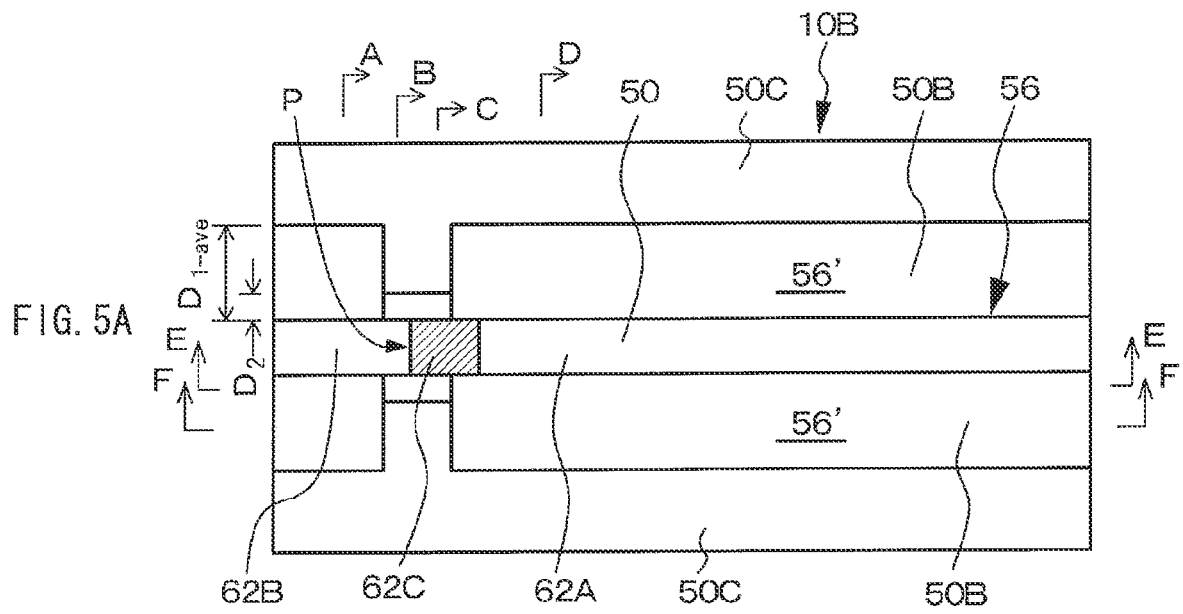
FIG. 5A is a schematic plain view of a laser diode device of a second exemplified embodiment.
Figure 5B:
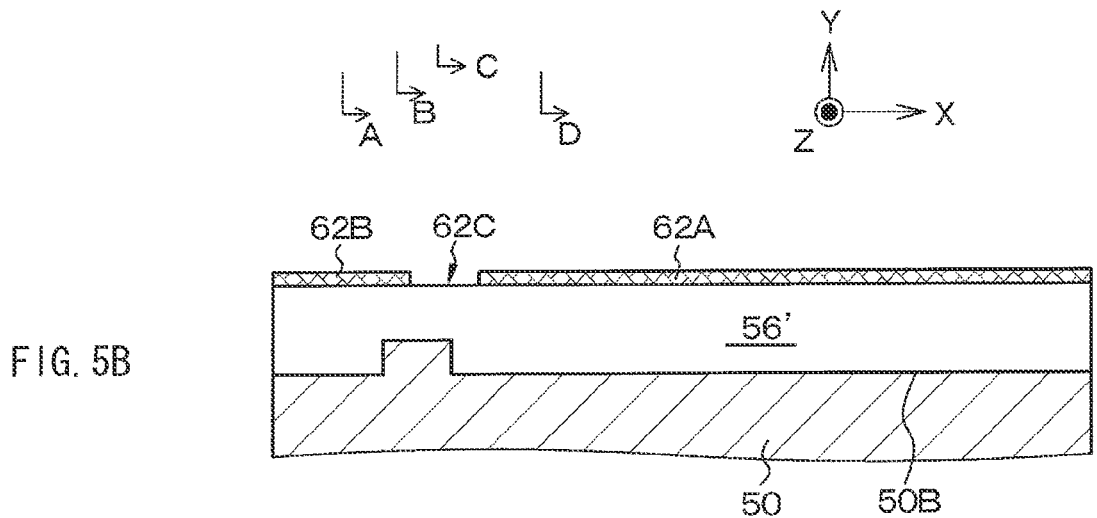
FIGS. 5B and 5C are schematic cross sectional views taken along the direction in which the resonator of the laser diode device extends (schematic cross sectional views cut along XZ plane).
Figure 5C:
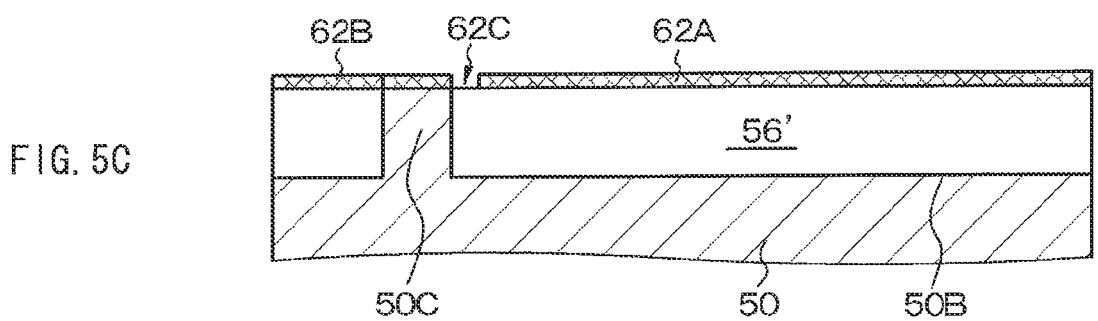
Figure 7A:
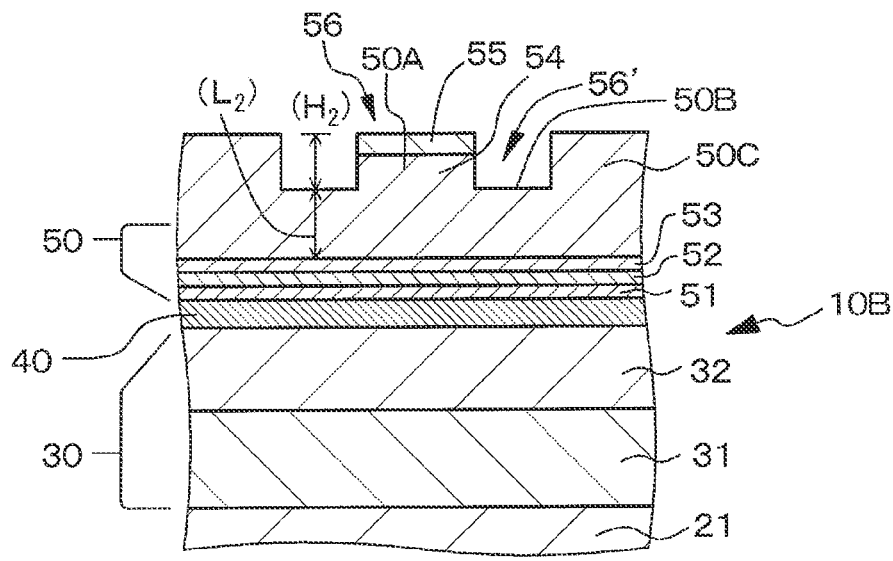
FIGS. 7A and 7B are schematic end views of the laser diode device of the second exemplified embodiment.
Figure 7B:
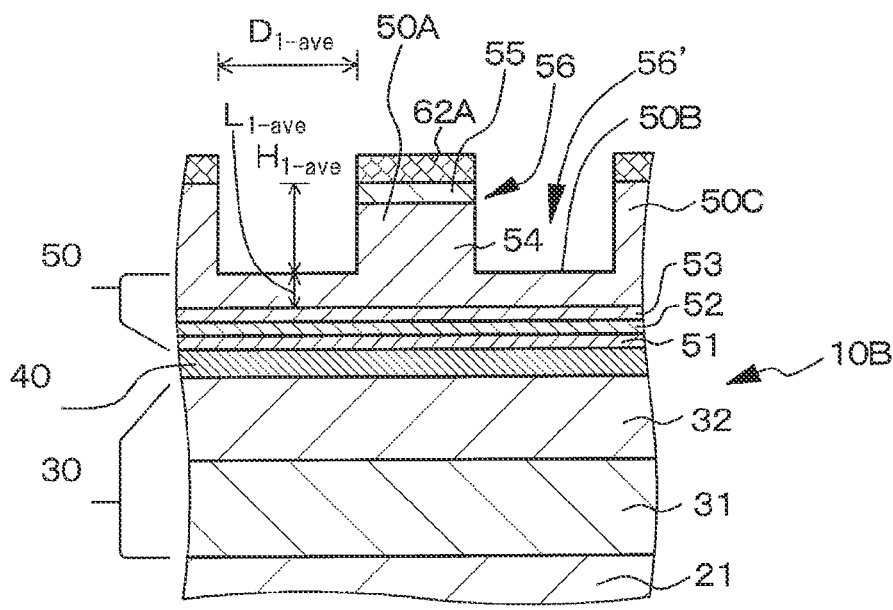

The second exemplified embodiment relates to the laser diode devices according to the second embodiment, the third embodiment, and the fifth embodiment of the present disclosure. FIG. 5A illustrates a schematic plain view of a laser diode device of the second exemplified embodiment. FIGS. 5B and 5C illustrate schematic cross sectional views taken along line E-E and line F-F of FIG. 5A (schematic end view cut along XZ plane). FIG. 6A illustrates a schematic end view taken along line A-A of FIG. 5A, FIG. 6B illustrates a schematic end view taken along line B-B of FIG. 5A, FIG. 7A illustrates a schematic end view taken along line C-C of FIG. 5A, and FIG. 7B illustrates a schematic end view taken along line D-D of FIG. 5A. In FIGS. 6A and 6B and FIGS. 7A and 7B, the laminated insulating film 57 is not illustrated.

Based on the expression of the laser diode device according to the second embodiment of the present disclosure, in a laser diode device 10B of the second exemplified embodiment, a second compound semiconductor layer exposed region 50B in which the second compound semiconductor layer 50 is exposed is provided on both sides of the ridge stripe structure 56; and $1 < L_2/L_{1-ave}$ is satisfied, and $1.1 \leq L_2/L_{1-ave} \leq 2.0$ is preferably satisfied, where the average distance from a portion of the third compound semiconductor layer 40 composing the light emitting region 41 to a top face of the second compound semiconductor layer exposed region 50B is $L_{1\text{-}ave}$, and the distance from a portion of the third compound semiconductor layer 40 composing the saturable absorption region 42 to the top face of the second compound semiconductor layer exposed region 50B is $L_2$ in the interface between the second section 62B of the second electrode 62 and the isolation trench 62C (interface region P). Further, $2.0 \leq D_2/D_{1\text{-}ave} \leq 3.5$ is satisfied, where the average width of the second compound semiconductor layer exposed region 50B in the light emitting region 41 along the direction (Y direction) orthogonal to the axis line direction (X direction) of the ridge stripe structure 56 is $D_{1\text{-}ave}$, and the width of the second compound semiconductor layer exposed region 50B in the saturable absorption region 42 along the direction (Y direction) orthogonal to the axis line direction (X direction) of the ridge stripe structure 56 is $D_2$ in the interface between the second section 62B of the second electrode 62 and the isolation trench 62C (interface region P). A portion of the second compound semiconductor layer opposed to a portion 50A of the second compound semiconductor layer 50 located under the second electrode 62 with the second compound semiconductor layer exposed region 50B in between is called a second compound semiconductor layer opposed region 50C for convenience. Further, a region sandwiched between the section 50A of the second compound semiconductor layer 50 and the second compound semiconductor layer opposed region 50C (region above the second compound semiconductor layer exposed region 50B) is called "concave section 56'" for convenience. Such a structure is often called "W ridge structure" as well.

Further, based on the expression of the laser diode device according to the third embodiment of the present disclosure, in the laser diode device 10B of the second exemplified embodiment, $H_2/H_{1\text{-}ave} < 1$ is satisfied, and $0.85 \leq H_2/H_{1\text{-}ave} \leq 0.98$ is preferably satisfied, where the average height of the ridge stripe structure 56 in the light emitting region 41 is $H_{1\text{-}ave}$, and the height of the ridge stripe structure 56 of the second section 62B of the second electrode 62 in the interface between the second section 62B of the second electrode 62 and the isolation trench 62C (interface region P) is $H_2$.

Specifically, in the second exemplified embodiment, $L_2$ was 80 μm, $L_{1\text{-}ave}$ was 65 μm, $H_2$ was 580 μm, $H_{1\text{-}ave}$ was 595 μm, $D_2$ was 3 μm, and $D_{1\text{-}ave}$ was 7 μm.

Further, in the laser diode device 10B of the second exemplified embodiment, a reducing section reducing light confinement effect is provided in a region on which electric field of the saturable absorption region 42 is concentrated. Specifically, the reducing means is embodied by $1 < L_2/L_{1\text{-}ave}$ or $H_2/H_{1\text{-}ave} < 1$.

In this case, to satisfy $1 < L_2/L_{1\text{-}ave}$ or $H_2/H_{1\text{-}ave} < 1$, at the time of dry etching of the second compound semiconductor layer 50 in the manufacturing process of the laser diode device, for example, micro loading effect may be used. That is, it is possible to use a fact that the etching rate of a compound semiconductor layer exposed at the bottom of a groove section with a narrow width is lower than the etching rate of a compound semiconductor layer exposed at the bottom of a groove section with a wide width. For that purpose, by satisfying specification of $2.0 \leq D_2/D_{1\text{-}ave} \leq 3.5$, the value of the distance $L_2$ in the interface region P of the second section 62B of the second electrode 62, and the average distance $L_{1\text{-}ave}$ in the light emitting region 41 satisfy $1 < L_2/L_{1\text{-}ave}$. Further, the value of the average height $H_{1\text{-}ave}$ of the ridge stripe structure 56 in the light emitting region 41 and the value of the height $H_2$ of the ridge stripe structure 56 in the interface region P of the second section 62B of the second electrode 62 satisfy $H_2/H_{1\text{-}ave} < 1$.

More specifically, in a step similar to step 110 of the first exemplified embodiment, after the Pd layer 63 is formed over the entire face of the second compound semiconductor layer 50 based on vacuum evaporation method, the Pd layer 63 is left in a region of the second compound semiconductor layer where the second electrode 62 including the isolation trench 62C should be formed and in a region of the second compound semiconductor layer where the second compound semiconductor layer opposed region 50C should be formed. Next, in a step similar to step 120 of the first exemplified embodiment, part of the exposed second compound semiconductor layer is etched with the use of the second electrode 62 as an etching-use mask.

Otherwise, it is possible that the value of the distance $L_2$ in the interface region P of the second section 62B of the second electrode 62, and the value of the average distance $L_{1\text{-}ave}$ in the light emitting region 41 satisfy $1 < L_2/L_{1\text{-}ave}$ by forming an appropriate resist layer in each case and etching the second compound semiconductor layer twice. That is, in the first etching, the concave section having the depth $H_2$ may be formed in the second compound semiconductor layer. In the second etching, the concave section having the depth $H_{1\text{-}ave}$ may be formed in the second compound semiconductor layer.

Otherwise, it is possible to satisfy $H_2/H_{1\text{-}ave} < 1$ by executing a step similar to step 110 of the first exemplified embodiment, subsequently forming the concave section of the depth $H_{1\text{-}ave}$, and removing part of the second compound semiconductor layer in the ridge stripe structure in the thickness direction.

As described above, in the laser diode device 10B of the second exemplified embodiment, $L_2/L_{1\text{-}ave} > 1$ is satisfied, and $H_2/H_{1\text{-}ave} < 1$ is satisfied. Thus, electric field is less likely to concentrate on the interface region of the saturable absorption region 42, light confinement effect is lowered, and damage is less likely to occur in the interface region of the saturable absorption region 42.

Third Exemplified Embodiment

Figure 8:
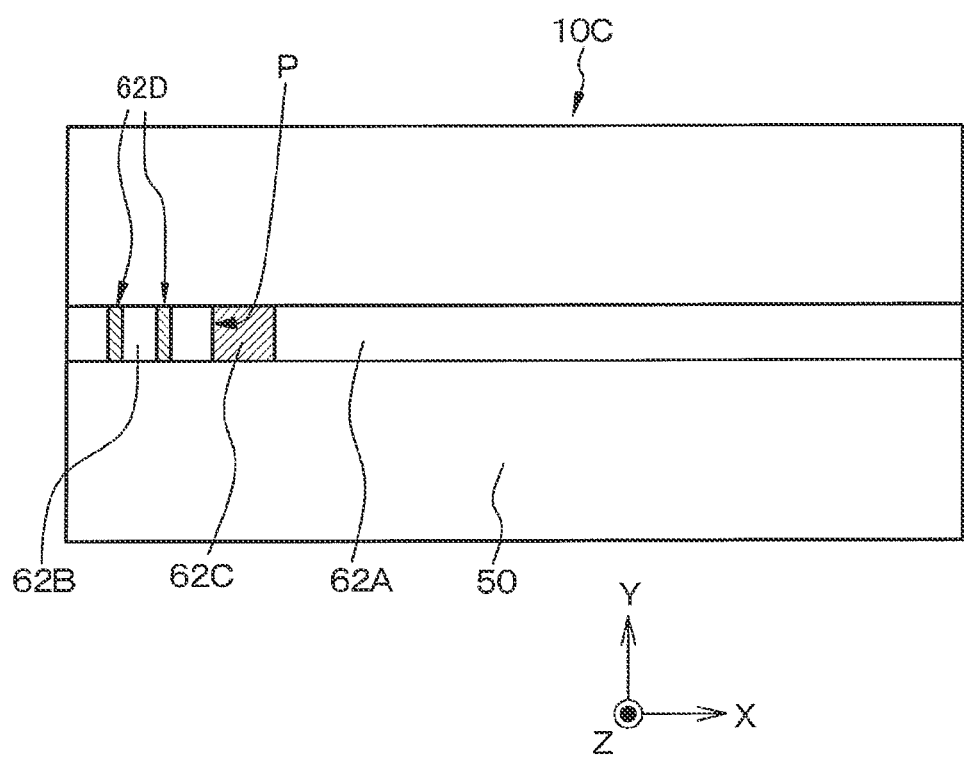
FIG. 8 is a schematic plain view of a laser diode device of a third exemplified embodiment.

The third exemplified embodiment relates to the laser diode devices according to the fourth embodiment and the fifth embodiment of the present disclosure. FIG. 8 illustrates a schematic plain view of the laser diode device of the third exemplified embodiment. In a laser diode device 10C of the third exemplified embodiment, the second section 62B of the second electrode 62 is composed of a plurality of sections. Though the number of the plurality of sections is "3" in the illustrated example, the number is not limited thereto. To compose the second section 62B of the second electrode 62 of the plurality of sections, the second section 62B of the second electrode 62 is separated into a plurality of sections by a second isolation trench 62D. The width of the second isolation trench 62D was 2 μm. In FIG. 8, the second isolation trench 62D region is shaded to clearly specify the second isolation trench 62D.

Further, in the laser diode device 10C of the third exemplified embodiment, a reducing section reducing light confinement effect is provided in a region on which electric field of the saturable absorption region 42 is concentrated. In this case, the reducing means is specifically embodied by composing the second section 62B of the second electrode 62 of the plurality of sections. The second isolation trench 62D may be formed together with the isolation trench 62C in a step similar to step 130 of the first exemplified embodiment, for example.

In the laser diode device 10C of the third exemplified embodiment, the second section 62B of the second electrode 62 is composed of the plurality of sections, and heat generated in the second section 62B of the second electrode 62 is easily diffused, and in the result, damage is less likely to occur in the second section of the second electrode. Further, since the saturable absorption region 42 is composed of the plurality of sections, electric field is less likely to concentrate on the interface region of the saturable absorption region 42, and damage is less likely to occur in the interface region of the saturable absorption region 42.

Descriptions have been hereinbefore given of the present disclosure with reference to the exemplified embodiments. However, the present disclosure is not limited to the foregoing exemplified embodiments. The configurations and the structures of the laser diode device described in the exemplified embodiments are just exemplification, and modifications may be made as appropriate. Further, in the exemplified embodiments, though various values have been shown, such various values are just exemplification as well, and thus it is needless to say that, for example, if specifications of the laser diode device to be used are changed, values are also changed. For example, the second electrode may have a laminated structure composed of a lower metal layer made of palladium (Pd) having a thickness of 20 nm and an upper metal layer made of nickel (Ni) having a thickness of 200 nm. In wet etching with the use of aqua regia, nickel etching rate is about 1.25 times as much as palladium etching rate.

The configuration and the structure of the laser diode device described in the first exemplified embodiment may be combined with the configuration and the structure of the laser diode device described in the second exemplified embodiment. The configuration and the structure of the laser diode device described in the first exemplified embodiment may be combined with the configuration and the structure of the laser diode device described in the third exemplified embodiment. The configuration and the structure of the laser diode device described in the second exemplified embodiment may be combined with the configuration and the structure of the laser diode device described in the third exemplified embodiment. The configuration and the structure of the laser diode device described in the first exemplified embodiment, the configuration and the structure of the laser diode device described in the second exemplified embodiment, and the configuration and the structure of the laser diode device described in the third exemplified embodiment may be combined with one another.

Figure 9A:
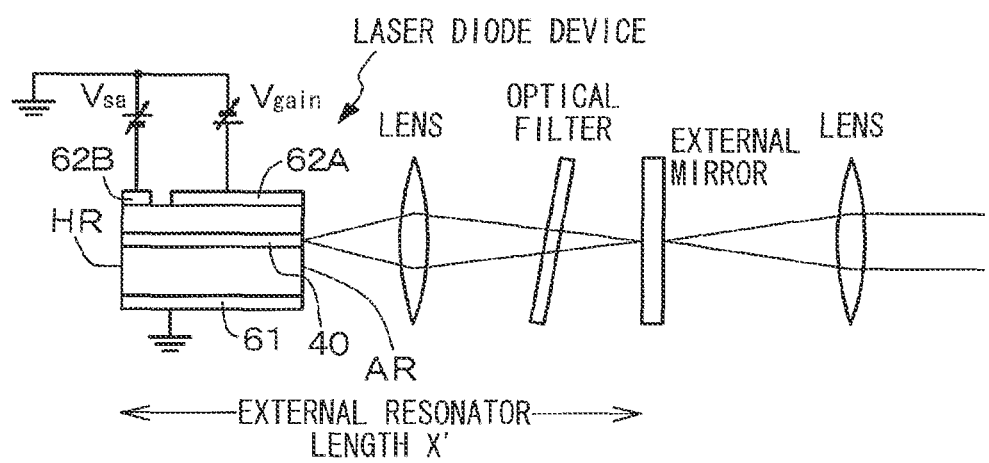
FIGS. 9A and 9B are views schematically illustrating a laser diode assembly performing mode-locking operation by configuring an external resonator with the use of the laser diode device of the embodiment of the present disclosure.

FIG. 9A illustrates a laser diode assembly performing mode-locking operation by configuring a light collecting external resonator with the use of the laser diode device of the present disclosure. In the light collecting external resonator illustrated in FIG. 9A, the external resonator is composed of an end face of the laser diode device in which a high reflective coating layer (HR) is formed on the saturable absorption region side and an external mirror, and light pulse is extracted from the external mirror. An absent reflex coating layer (AR) is formed in an end face (light emitting end face) of the laser diode device on a light emitting region (gain region) side. As an optical filter, a bandpass filter is mainly used, and is inserted to control laser oscillation wavelength. Mode locking is determined by a direct current applied to the light emitting region and the reverse bias voltage $V_{sa}$ applied to the saturable absorption region. Repetition frequency f of optical pulse train is determined by external resonator length X', and the resultant is expressed by the following formula f=c/(2n·X'), where c is light velocity and n is a refractive index of waveguide.

Figure 9B:
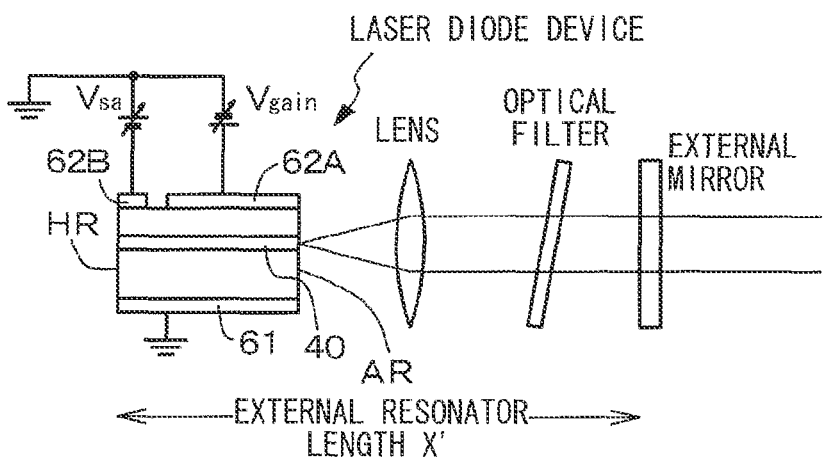

Further, FIG. 9B illustrates another modification configuring an external resonator with the use of the laser diode device of the present disclosure. In the collimated external resonator illustrated in FIG. 9B, the external resonator is composed of an end face of the laser diode device in which a high reflective coating layer (HR) is formed on the saturable absorption region side and an external mirror, and light pulse is extracted from the external mirror. An absent reflex coating layer (AR) is formed in an end face (light emitting end face) of the laser diode device on a light emitting region (gain region) side.

Figure 10:
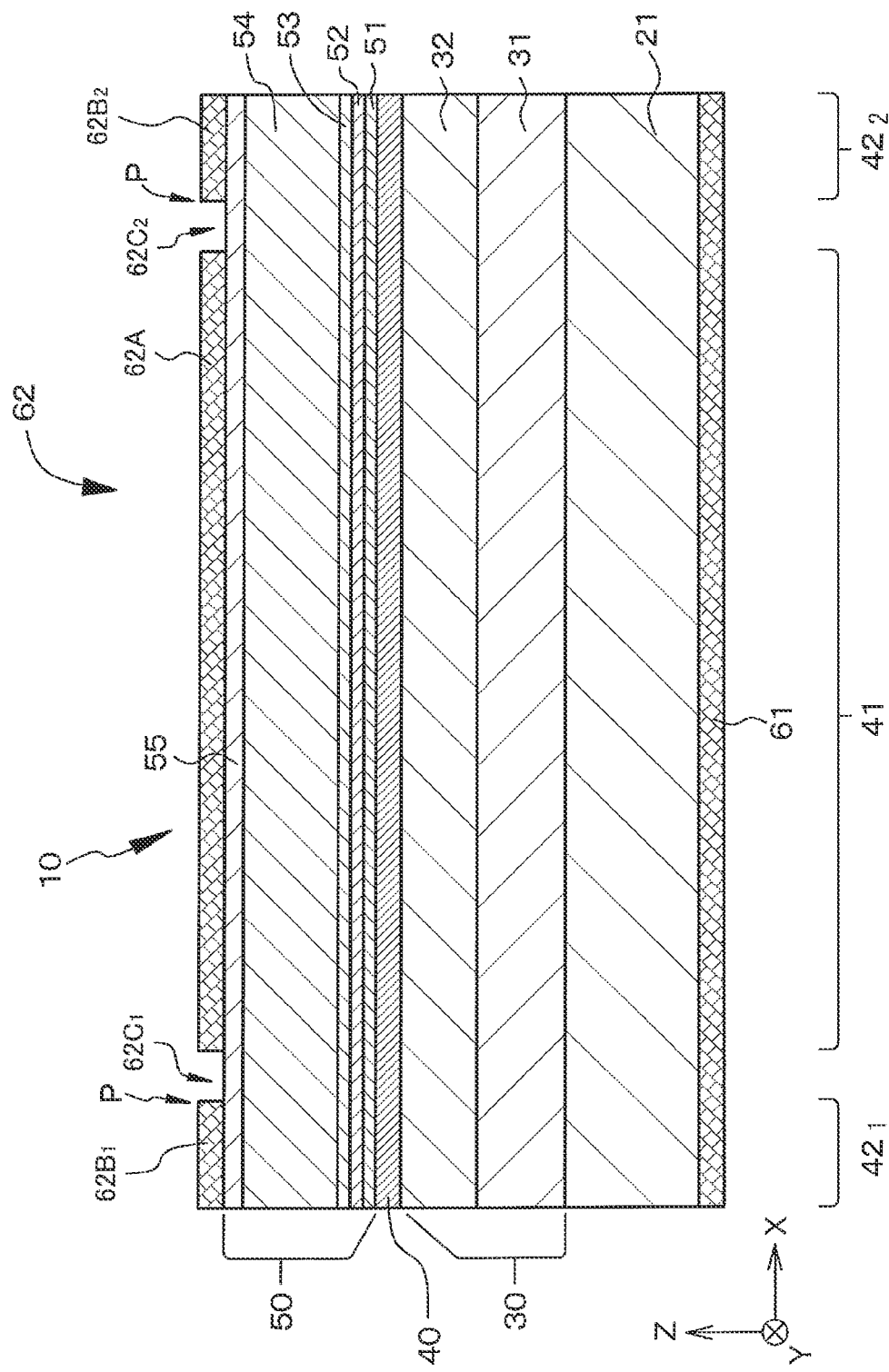
FIG. 10 is a schematic end view along direction in which a resonator of a modification of the laser diode device of the first exemplified embodiment extends (schematic end view cut along XZ plane).
Figure 11:
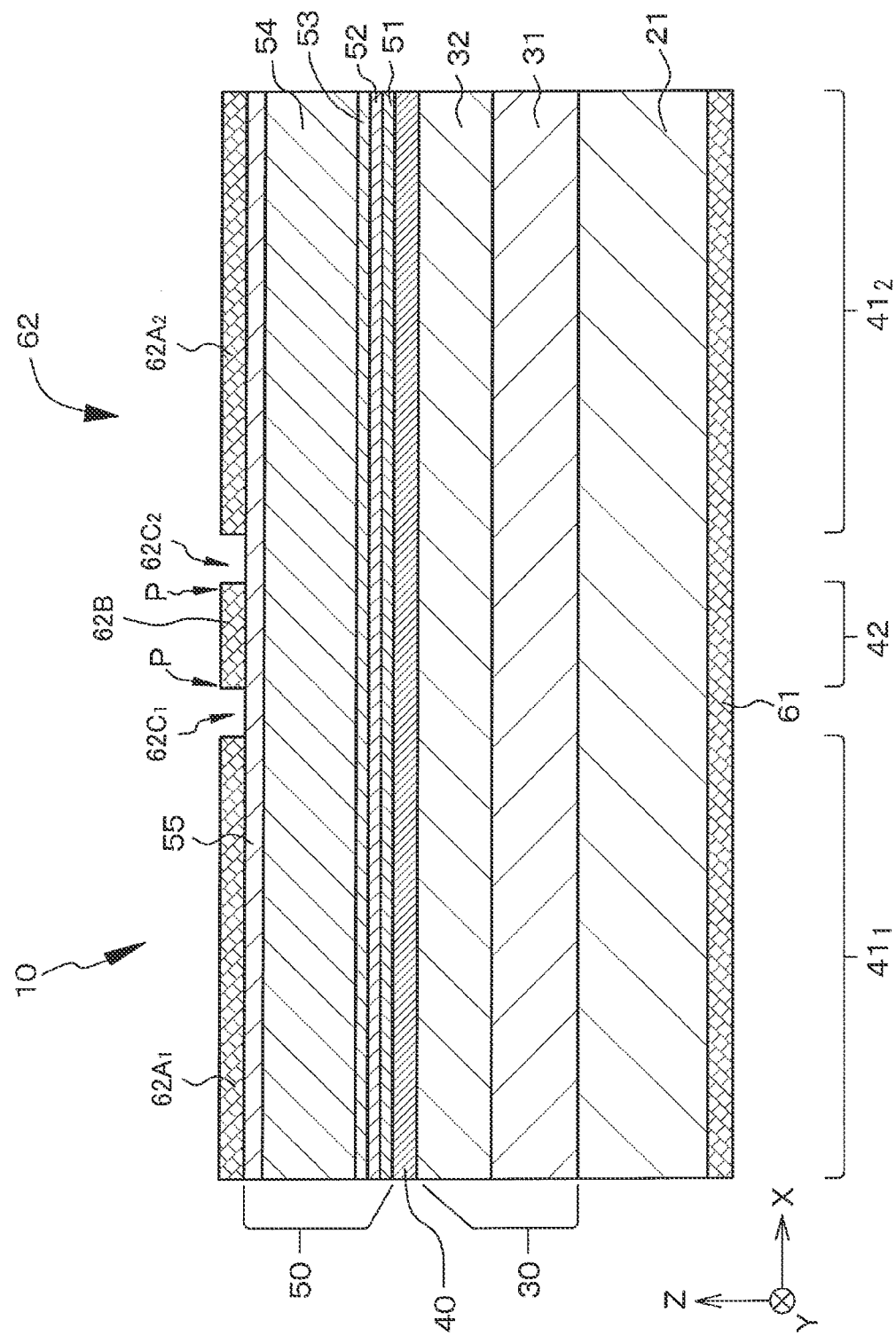
FIG. 11 is a schematic end view along direction in which a resonator of still another modification of the laser diode device of the first exemplified embodiment extends (schematic end view cut along XZ plane).

The number of the light emitting regions 41 and the saturable absorption regions 42 is not limited to one. FIG. 10 illustrates a schematic end view of a laser diode device in which one first section 62A of the second electrode and two second sections $62B_1$ and $62B_2$ of the second electrode are provided (schematic end view cut along XZ plane). In the laser diode device, one end of the first section 62A is opposed to one second section $62B_1$ with one isolation trench $62C_1$ in between, and the other end of the first section 62A is opposed to the other second section $62B_2$ with the other isolation trench $62C_2$ in between. Further, one light emitting region 41 is sandwiched between two saturable absorption regions $42_1$ and $42_2$. Further, FIG. 11 illustrates a schematic end view of a laser diode device in which two first sections $62A_1$ and $62A_2$ of the second electrode and one second section 62B of the second electrode are provided (schematic end view cut along XZ plane). In the laser diode device, an end section of the second section 62B is opposed to one first section $62A_1$ with one isolation trench $62C_1$ in between, and the other end of the second section 62B is opposed to the other first section $62A_2$ with the other isolation trench $62C_2$ in between. Further, one saturable absorption region 42 is sandwiched between two light emitting regions $41_1$ and $41_2$. In FIG. 10 and FIG. 11, two interface regions P exist, to which the configuration and the structure of the laser diode device of the first exemplified embodiment or the second exemplified embodiment are applicable. Otherwise, in the laser diode device illustrated in FIG. 10, the configuration and the structure of the laser diode device of the first exemplified embodiment or the second exemplified embodiment are applicable to only the interface region P on the light reflective end face side. Further, it is needless to say that the second isolation trench of the laser diode device described in the third exemplified embodiment is applicable to the laser diode device illustrated in FIG. 10 and FIG. 11.

Figure 12:
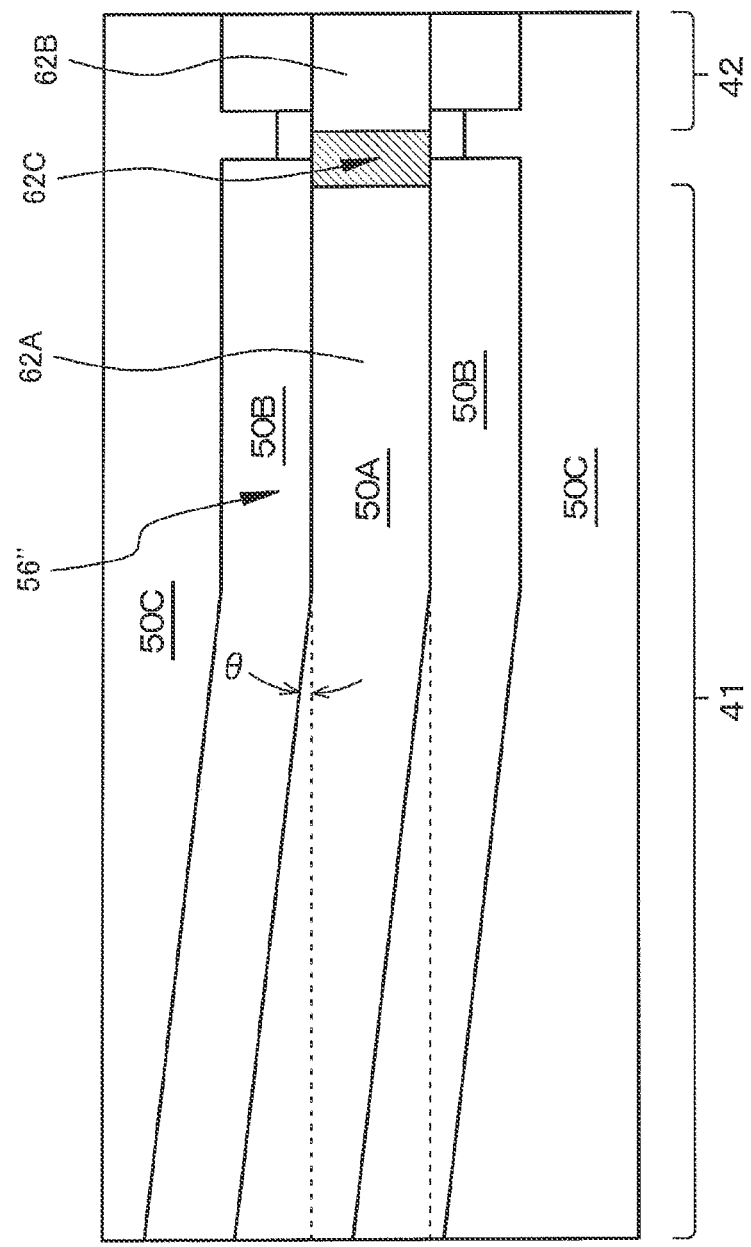
FIG. 12 is a schematic view viewed from above of a ridge stripe structure in a modification of the laser diode device of the second exemplified embodiment.

The laser diode device may be a laser diode device having an oblique ridge stripe type separate confinement heterostructure with oblique light guide. FIG. 12 illustrates an example in which the oblique ridge stripe structure with oblique light guide is applied to the laser diode device described in the second exemplified embodiment. FIG. 12 is a schematic view viewed from above of a ridge section 56". The laser diode device has a structure in which two straight line-like ridge stripe structures are combined. A value of angle θ of intersection of the two ridge stripe structures desirably satisfies, for example, 0<θ≤10 (deg), and preferably satisfies 0<θ≤6 (deg). By adopting the oblique ridge stripe type, reflectance of the end face provided with low reflective coating is able to be closer to 0% as the ideal value. In the result, generation of laser light that would revolve in the laser diode device is able to be prevented, and generation of sub laser light associated with main laser light is able to be inhibited. It is needless to say that such a laser diode device is applicable to the laser diode device described in the first exemplified embodiment or the third exemplified embodiment.

In the exemplified embodiments, the laser diode device is provided on the {0001} plane, which is the C plane as the polarity plane of the n-type GaN substrate 21. In this case, in some cases, it is difficult to electrically control saturable absorption due to QCSE effect (quantum confinement Stark effect) by internal electric field resulting from piezoelectric polarization and intrinsic polarization in the third compound semiconductor layer. In other words, in some cases, it is necessary to increase a direct current value flown to the first electrode to obtain self-pulsation operation and mode-locking operation, and reverse bias voltage value applied to the saturable absorption region, subpulse component associated with main pulse is generated, or synchronous is difficult to be obtained between an external signal and light pulse. To inhibit such a phenomenon, the laser diode device may be provided on A plane as {11-20} plane, M plane as {1-100} plane, non-polarity plane such as {1-102} plane, {11-2n} plane including {11-24} plane and {11-22} plane, or a semi-polarity plane such as {10-11} plane and {10-12} plane. Even if piezoelectric polarization and intrinsic polarization are thereby generated in the third compound semiconductor layer of the laser diode device, piezoelectric polarization is not generated in the thickness direction of the third compound semiconductor layer and piezoelectric polarization is generated in the direction approximately perpendicular to the thickness direction of the third compound semiconductor layer. Thus, adverse effect resulting from piezoelectric polarization and intrinsic polarization is able to be excluded. {11-2n} plane means a non-polarity plane making 40 deg approximately with respect to the C plane. In the case where the laser diode device is provided on a non-polarity plane or on a semi-polarity plane, limitation of the thickness of the well layer (from 1 nm to 10 nm both inclusive) and limitation of the impurity doping concentration of the barrier layer (from $2*10^{18}$ cm$^{-3}$ to $1*10^{20}$ cm$^{-3}$ both inclusive) as described in the first exemplified embodiment are able to be eliminated.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The application is claimed as follows:

1. A laser diode device comprising:
a laminated structure in which a first compound semiconductor layer that has a first conductivity type and is composed of GaN compound semiconductor, a third compound semiconductor layer that has a light emitting region and a saturable absorption region composed of GaN compound semiconductor, and a second compound semiconductor layer that has a second conductivity type different from the first conductivity type and is composed of GaN compound semiconductor are sequentially layered;
a second electrode formed on the second compound semiconductor layer; and
a first electrode electrically connected to the first compound semiconductor layer,
wherein the laminated structure has ridge stripe structure,
the second electrode is separated into a first section to obtain forward bias state by applying a direct current to the first electrode through the light emitting region and a second section to add electric field to the saturable absorption region by an isolation trench, and
$1.5 \leq W_2/W_{MIN} \leq 20$ is satisfied, where minimum width of the ridge stripe structure is $W_{MIN}$, and width of the ridge stripe structure of the second section of the second electrode in a first interface between the second section of the second electrode and the isolation trench is $W_2$, and
wherein the width of the second section of the second electrode is constant in a direction from the first interface between the second section of the second electrode and the isolation trench towards an outer end of the second section opposite to said first interface,
wherein the width of the first section of the second electrode is constant in a direction from a second interface between the first section of the second electrode and the isolation trench towards an outer end of the first section opposite to said second interface,
wherein the width of the first section of the second electrode is less than the width of the second section of the second electrode, and
wherein a width of the isolation trench decreases in a direction from the interface between the second section of the second electrode and the isolation trench to an interface between the first section of the second electrode and the isolation trench.

2. The laser diode device according to claim 1, wherein electric resistance value between the first section and the second section of the second electrode is $1*10^2 \Omega$ or more.

3. The laser diode device according to claim 1, wherein width of the isolation trench that separates the second electrode into the first section and the second section is 2 μm or more.

4. The laser diode device according to claim 1, wherein laser light is emitted from an end face of the laminated structure on the light emitting region side.

* * * * *